United States Patent
Sekiguchi

(10) Patent No.: US 9,958,721 B2
(45) Date of Patent: May 1, 2018

(54) CURVED DISPLAY DEVICE

(71) Applicant: PANASONIC INTELLECTUAL PROPERTY MANAGEMENT CO., LTD., Osaka (JP)

(72) Inventor: Tomohiro Sekiguchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days. days.

(21) Appl. No.: 15/239,573

(22) Filed: Aug. 17, 2016

(65) Prior Publication Data

US 2016/0357058 A1 Dec. 8, 2016

Related U.S. Application Data

(63) Continuation of application No. PCT/JP2015/005410, filed on Oct. 28, 2015.

(30) Foreign Application Priority Data

Mar. 19, 2015 (JP) .................................. 2015-056805

(51) Int. Cl.
*H05K 7/20* (2006.01)
*G02F 1/1333* (2006.01)
(Continued)

(52) U.S. Cl.
CPC .. *G02F 1/133385* (2013.01); *G02F 1/133308* (2013.01); *G06F 1/1601* (2013.01);
(Continued)

(58) Field of Classification Search
CPC ......... G02F 1/133305; G02F 1/133385; G02F 2001/133317; H05K 7/20963;
(Continued)

(56) References Cited

U.S. PATENT DOCUMENTS 5,469,020 A * 11/1995 Herrick ................. G02F 1/1365
257/E25.02
5,831,374 A * 11/1998 Morita ............... H05K 7/20963
313/46

(Continued)

FOREIGN PATENT DOCUMENTS

JP 2003-008264 A 1/2003
JP 2005-331945 A 12/2005
(Continued)

OTHER PUBLICATIONS

International Search Report and Written Opinion issued in International Patent Application No. PCT/JP2015/005410, dated Jan. 26, 2016.

*Primary Examiner* — Robert J Hoffberg
*Assistant Examiner* — Matt Dhillon
(74) *Attorney, Agent, or Firm* — McDermott Will & Emery LLP

(57) ABSTRACT

A first integrated circuit disposed in a region, in which a length of a first space in a device depth direction is largest, among two regions dividing an entire region of a first main surface of a signal processing circuit board into two in a device width direction. The first space is a space between the signal processing circuit board and a metal chassis, which is a member of the metal chassis and a back cover that opposes the first main surface on which the first integrated circuit is mounted. A first heat sink is disposed between the metal chassis and the back cover and has a plurality of fins. A length of each of the plurality of fins in the device depth direction is set according to a length of the first space in the device depth direction at a position of the fin in the device width direction.

7 Claims, 18 Drawing Sheets

(51) Int. Cl.
  *H04N 5/64* (2006.01)
  *G06F 1/16* (2006.01)
  *G06F 1/20* (2006.01)
  *G02F 1/1335* (2006.01)
  *G02F 1/1337* (2006.01)
  *G02F 1/1345* (2006.01)

(52) U.S. Cl.
  CPC .............. *G06F 1/20* (2013.01); *H04N 5/64* (2013.01); *H05K 7/20963* (2013.01); *G02F 1/1337* (2013.01); *G02F 1/13452* (2013.01); *G02F 1/133305* (2013.01); *G02F 1/133528* (2013.01); *G02F 2001/13332* (2013.01); *G02F 2001/133302* (2013.01); *G02F 2001/133317* (2013.01)

(58) Field of Classification Search
  CPC ........... H05K 7/20981; H05K 7/20281; H05K 7/20272; H01L 51/524; H01L 51/5253; H01L 51/525; H01L 51/5246
  USPC .................................................. 345/173, 174
  See application file for complete search history.

(56) References Cited

U.S. PATENT DOCUMENTS

| | | | |
|---|---|---|---|
| 6,538,380 B1* | 3/2003 | Kanagu | H01J 9/241 313/495 |
| 7,423,864 B2* | 9/2008 | Kim | H05K 5/02 313/231.31 |
| 7,733,024 B2* | 6/2010 | Woo | H01J 9/261 313/582 |
| 8,616,738 B2* | 12/2013 | Kuo | H05K 7/20963 362/373 |
| 9,141,142 B2* | 9/2015 | Murakami | G06F 1/1616 |
| 2005/0259401 A1 | 11/2005 | Han et al. | |
| 2006/0018092 A1* | 1/2006 | Nagano | F16M 11/10 361/679.21 |
| 2006/0187642 A1 | 8/2006 | Jeong | |
| 2007/0081344 A1* | 4/2007 | Cappaert | G02B 6/0085 362/373 |
| 2008/0068806 A1 | 3/2008 | Han et al. | |
| 2009/0135095 A1 | 5/2009 | Kawada | |
| 2011/0079370 A1 | 4/2011 | Wen et al. | |
| 2012/0020056 A1 | 1/2012 | Yamagata et al. | |
| 2013/0155655 A1 | 6/2013 | Lee et al. | |
| 2013/0329162 A1* | 12/2013 | Fujii | H05K 7/14 349/58 |
| 2014/0133073 A1 | 5/2014 | Ahn et al. | |
| 2014/0340870 A1* | 11/2014 | Premysler | F21V 29/402 362/84 |
| 2014/0355805 A1* | 12/2014 | Park | H04N 5/64 381/333 |
| 2015/0316810 A1 | 11/2015 | Shibahara | |

FOREIGN PATENT DOCUMENTS

| | | |
|---|---|---|
| JP | 2006-053529 A | 2/2006 |
| JP | 2006-237558 A | 9/2006 |
| JP | 2013-134295 A | 7/2013 |
| JP | 2014-095901 A | 5/2014 |
| JP | 2014-232323 A | 12/2014 |
| WO | 2007/020697 A1 | 2/2007 |
| WO | 2010/125976 A1 | 11/2010 |
| WO | 2014/002779 A1 | 1/2014 |
| WO | 2014/017068 A1 | 1/2014 |

* cited by examiner

CURVED DISPLAY DEVICE

RELATED APPLICATIONS

This application is a Continuation of International Patent Application No. PCT/JP2015/005410, filed on Oct. 28, 2015, which in turn claims the benefit of Japanese Application No. 2015-056805, filed on Mar. 19, 2015, the disclosures of which Applications are incorporated by reference herein.

BACKGROUND

1. Technical Field

The present disclosure relates to a curved display device whose both end sides in a device width direction protrude forward from a center side.

2. Description of the Related Art

Unexamined Japanese Patent Publication No. 2014-232323 discloses a curved display device whose both end sides in a device width direction protrude forward from a center side. Furthermore, Unexamined Japanese Patent Publication No. 2014-232323 also discloses that a reinforcing member for reinforcing a chassis is used as a heat radiating member for radiating heat generated from circuit boards.

SUMMARY

The present disclosure provides a curved display device capable of suppressing an increase in temperature of a circuit board due to heat generated from circuit components for driving a display panel.

A curved display device according to the present disclosure includes a display panel, a chassis, a back cover, and circuit boards. The display panel, the chassis, and the back cover each have a curved shape such that both end sides of the display panel in a device width direction protrude forward relative to a center side of the display panel. On a first main surface of a circuit board, a first circuit component for driving the display panel and a first heat sink for cooling the first circuit component are mounted. When a first space is assumed to represent a space between the circuit board and a member, which is one of the chassis and the back cover that opposes the first main surface on which the first circuit component is mounted, the first circuit component is disposed in a region where a length of the first space in a device depth direction is longest, among a plurality of regions obtained by dividing an entire region of the first main surface of the circuit board by two or three in the device width direction, the first heat sink is disposed in the first space and has a plurality of fins extending toward the device depth direction, and a length of each of the plurality of fins in the device depth direction is set according to a length of the first space in the device depth direction at a position of the fin in the device width direction.

According to the present disclosure, the first circuit component is disposed at a position in the device width direction where the length of the first space in the device depth direction is relatively long in the circuit board. Therefore, heat generated from the first circuit component easily diffuses into the first space. Furthermore, the first circuit component is cooled by the first heat sink. In this case, length of each of a plurality of fins in the device depth direction of the first heat sink at the position in the device width direction where the first circuit component is disposed are longer than lengths of fins at other positions in the device width direction. Therefore, it is possible to cool the first circuit component more effectively by using the first heat sink than by using other components. Accordingly, increases in temperatures of the first circuit component and the circuit board due to heat generated from the first circuit component may be effectively suppressed.

DETAILED DESCRIPTION

Hereinafter, exemplary embodiments will be described in detail with reference to the drawings as deemed appropriate. However, an unnecessarily detailed description may be omitted. For example, detailed description of already well-known matters and duplicated description for substantially the same structure may be omitted. This is to avoid a following description from being unnecessarily redundant and to facilitate understanding of those skilled in the art.

It should be noted that the accompanying drawings and the description below are provided to help those skilled in the art fully understand the present disclosure and it is not intended to limit the subject matter recited in the claims by these.

First Exemplary Embodiment

A curved display device according to a first exemplary embodiment is described.

[1-1. Structure]

With respect to a position and a direction in a following description, a side of a display panel of a liquid crystal display device on which an image is displayed is denoted as a "front surface" and a side opposite to the front surface is denoted as a "rear surface" unless otherwise specified. Furthermore, a direction in parallel with a longitudinal direction of a display panel of a curved display device is denoted as a "device width direction". In addition, a direction orthogonal to the device width direction and approximately orthogonal to the front surface and the rear surface of the curved display device is denoted as a "device depth direction". Furthermore, "upper" and "lower" refer to "upper" and "lower" when a display panel is viewed from the front surface side in a posture taken during use of the liquid crystal display device.

[1-1-1. Summary of Curved Display Device]

Figure 1:
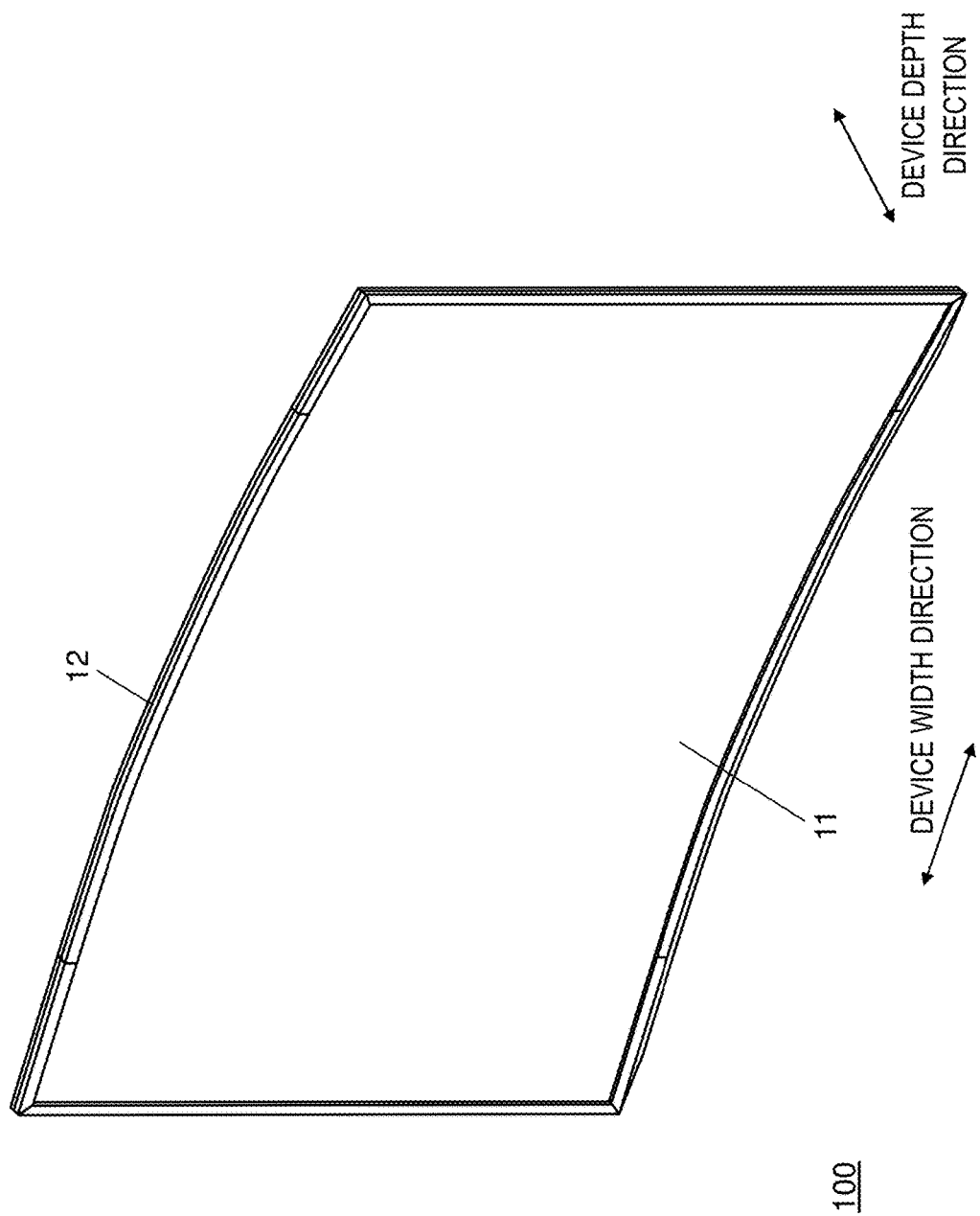
FIG. 1 is a front perspective view of a curved display device according to a first exemplary embodiment.
Figure 2:
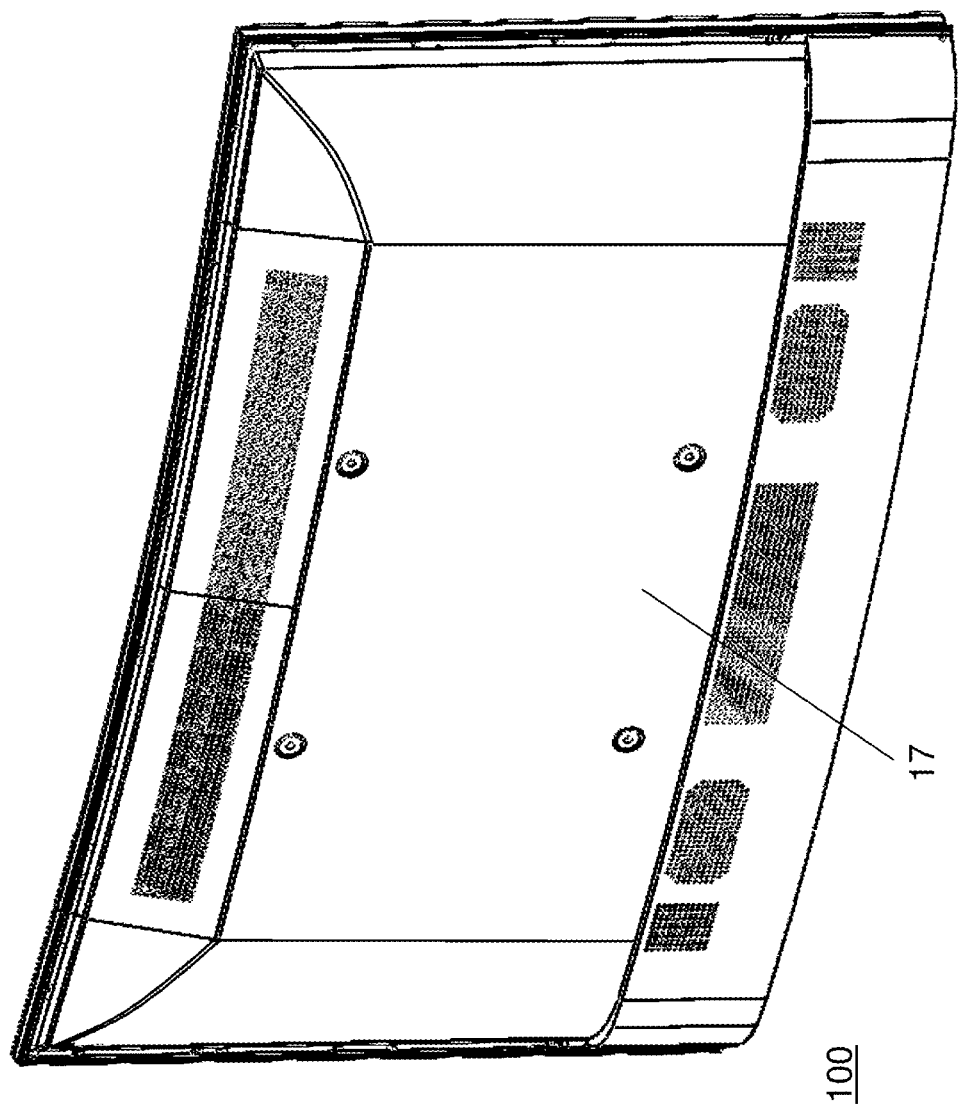
FIG. 2 is a rear perspective view of the curved display device according to the first exemplary embodiment.

FIG. 1 is a front perspective view of curved display device 100 according to the first exemplary embodiment. FIG. 2 is a rear perspective view of curved display device 100 according to the first exemplary embodiment. As illustrated in FIG. 1 and FIG. 2, curved display device 100 has a curved shape such that both end sides in a width direction of curved display device 100 (hereinafter, referred to as a "device width direction" as deemed appropriate) protrude forward from a center side. Therefore, a front surface and a rear surface of curved display device 100 have a curved surface shape.

Figure 3:
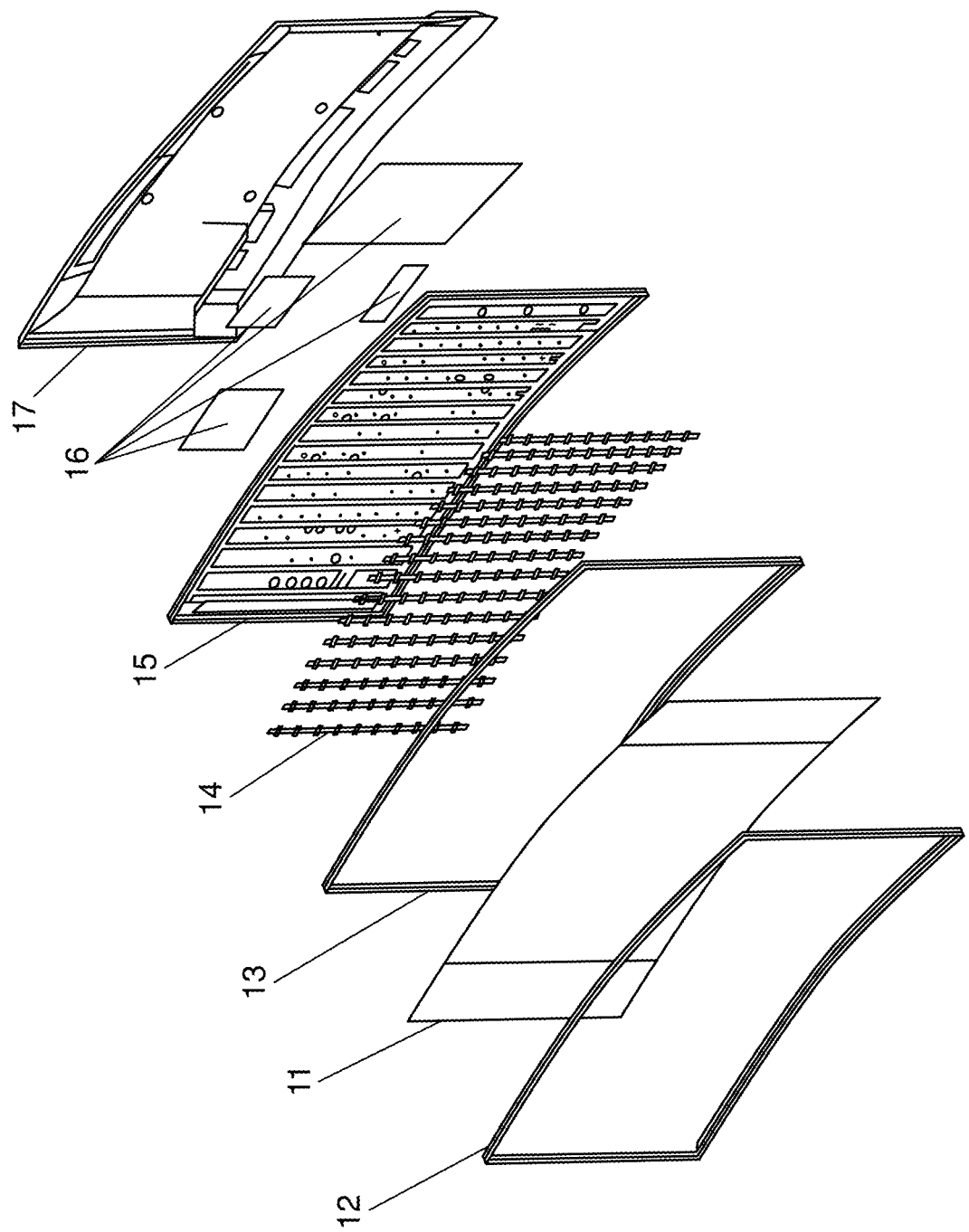
FIG. 3 is a front exploded perspective view of the curved display device according to the first exemplary embodiment.

FIG. 3 is a front exploded perspective view of curved display device 100 according to the first exemplary embodiment. As illustrated in FIG. 3, curved display device 100 has display panel 11, bezel 12, mold frame 13, LED bar array 14, metal chassis 15, a plurality of circuit boards 16, and back cover 17.

Display panel 11, bezel 12, mold frame 13, metal chassis 15, and back cover 17 each have a curved shape such that both end sides in the device width direction protrude forward from a center side.

Display panel 11 is a liquid crystal display panel having horizontal and vertical polarizing filters, a glass substrate, an alignment film, and a liquid crystal layer. Display panel 11 is disposed in a front surface side of LED bar array 14. Display panel 11 has an image display region for displaying an image in the front surface. The image display region is exposed to an outside through an opening of bezel 12 so as to be visible. Display panel 11 is, for example, a so-called 4K type high-resolution display in which a number of horizontal pixels is 3840 and a number of vertical pixels is 2160. Note that the present disclosure is applicable to high-resolution displays having resolutions equal to or higher than the above such as an 8K type.

Bezel 12 is formed of material such as resin or metal. Bezel 12 has a rectangular frame-like shape. Bezel 12 is disposed on the front surface side of display panel 11. Bezel 12 surrounds display panel 11 and holds display panel 11 from the front surface side.

Mold frame 13 is formed of material such as resin or metal. Mold frame 13 has a rectangular frame-like shape. Mold frame 13 is disposed on a rear surface side of display panel 11 and holds display panel 11 from the rear surface side.

LED bar array 14 constitutes a light source. Metal chassis 15 is disposed on the rear surface side of display panel 11 and holds mold frame 13 and LED bar array 14. Each circuit board 16 is fixed on the rear surface side of metal chassis 15. Each circuit board 16 has a plate shape.

Back cover 17 is a component constituting an exterior of a rear surface of curved display device 100. Back cover 17 is disposed with an interval from metal chassis 15 in the device depth direction. In addition, back cover 17 has vent holes in an upper portion and a lower portion. Heat generated from the plurality of circuit boards 16 warms air inside a space within curved display device 100 to cause air to flow in an ascending direction inside the space. Therefore, air flows into the space within curved display device 100 through the vent hole at the lower portion of back cover 17 and in-flowed air ascends and flows out through the vent hole at the upper portion. Each circuit board 16 is cooled by this air flow.

Figure 4:
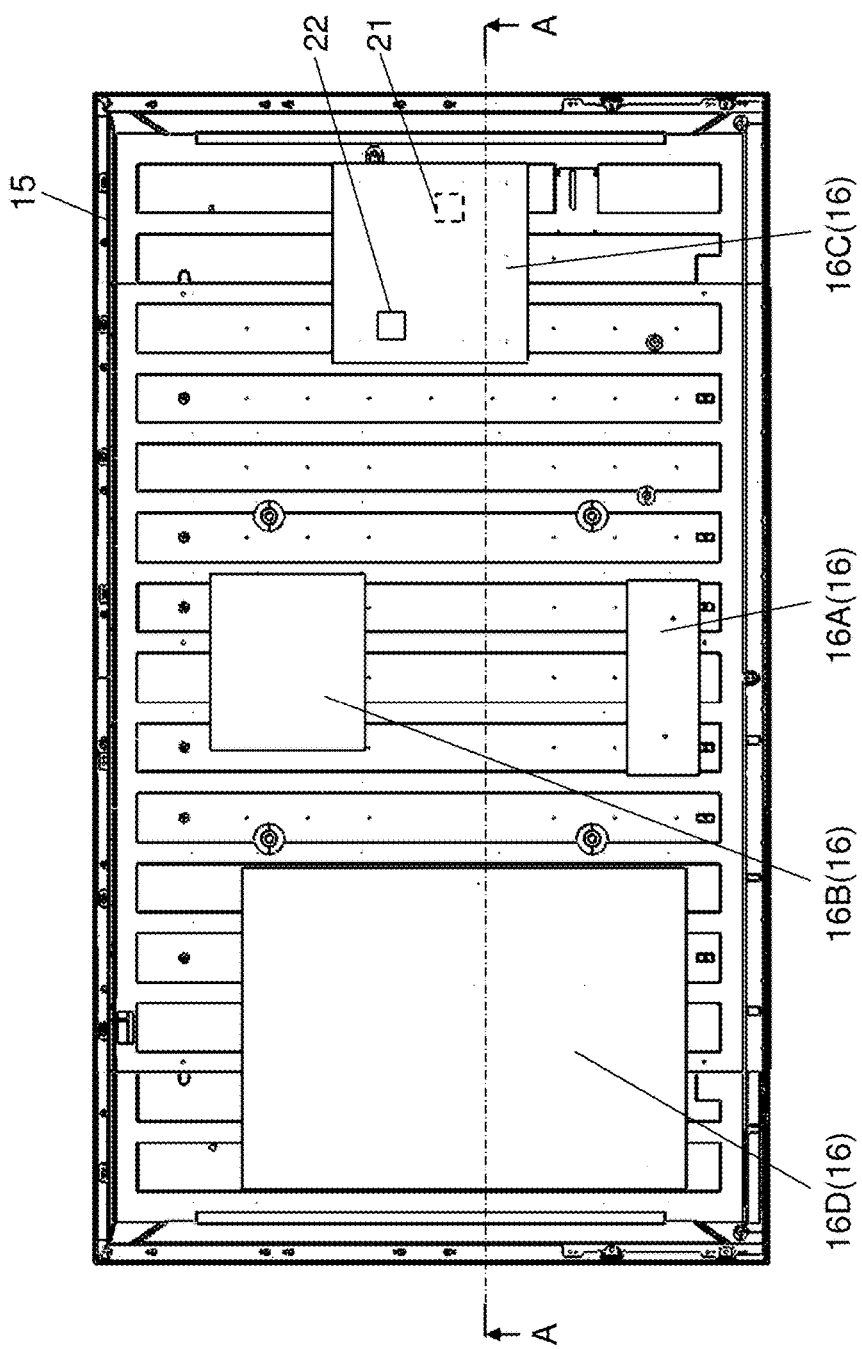
FIG. 4 is a rear view of the curved display device according to the first exemplary embodiment with a back cover removed.

FIG. 4 is a rear view of the curved display device according to the first exemplary embodiment with back cover 17 removed. In the present exemplary embodiment, drive circuit board 16A, LED driver circuit board 16B, signal processing circuit board 16C, and power supply circuit board 16D are provided as the plurality of circuit boards 16.

Drive circuit board 16A is a board on which circuit components and the like for driving display panel 11 are mounted. LED driver circuit board 16B is a board on which circuit components and the like for causing LED bar array 14 to emit light are mounted. Signal processing circuit board 16C is a board on which a storage device and circuit components and the like for performing an image processing or audio processing are mounted. Power supply circuit board 16D is a board on which power supply components and the like for generating electric power supplied to the above various boards and the like are mounted.

[1-1-2. Mounting Structure of Circuit Boards on Metal Chassis and Mounting Structure of Circuit Components and the like on Circuit Boards]

Figure 5:
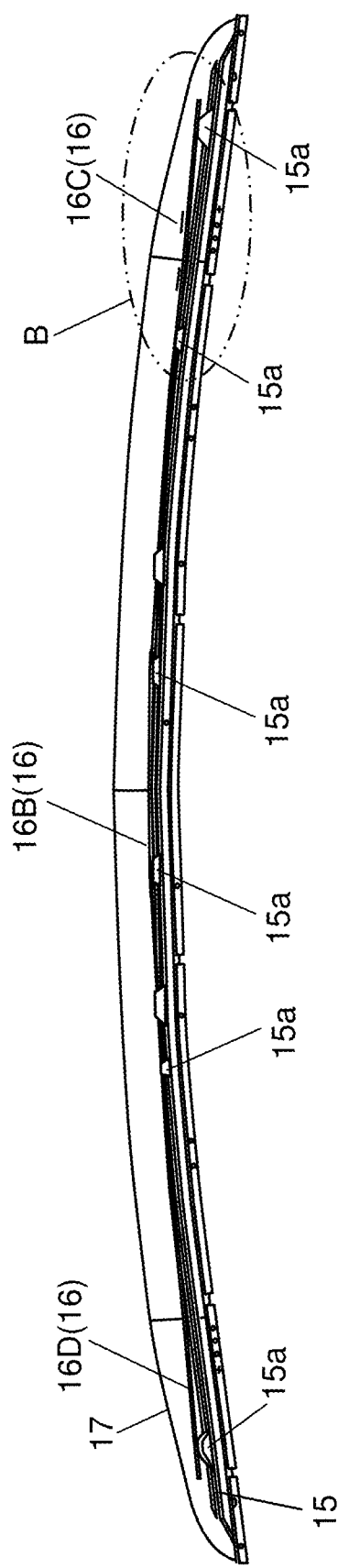
FIG. 5 is a cross-sectional view taken along line A-A of the curved display device of FIG. 4 with the back cover attached.
Figure 6:
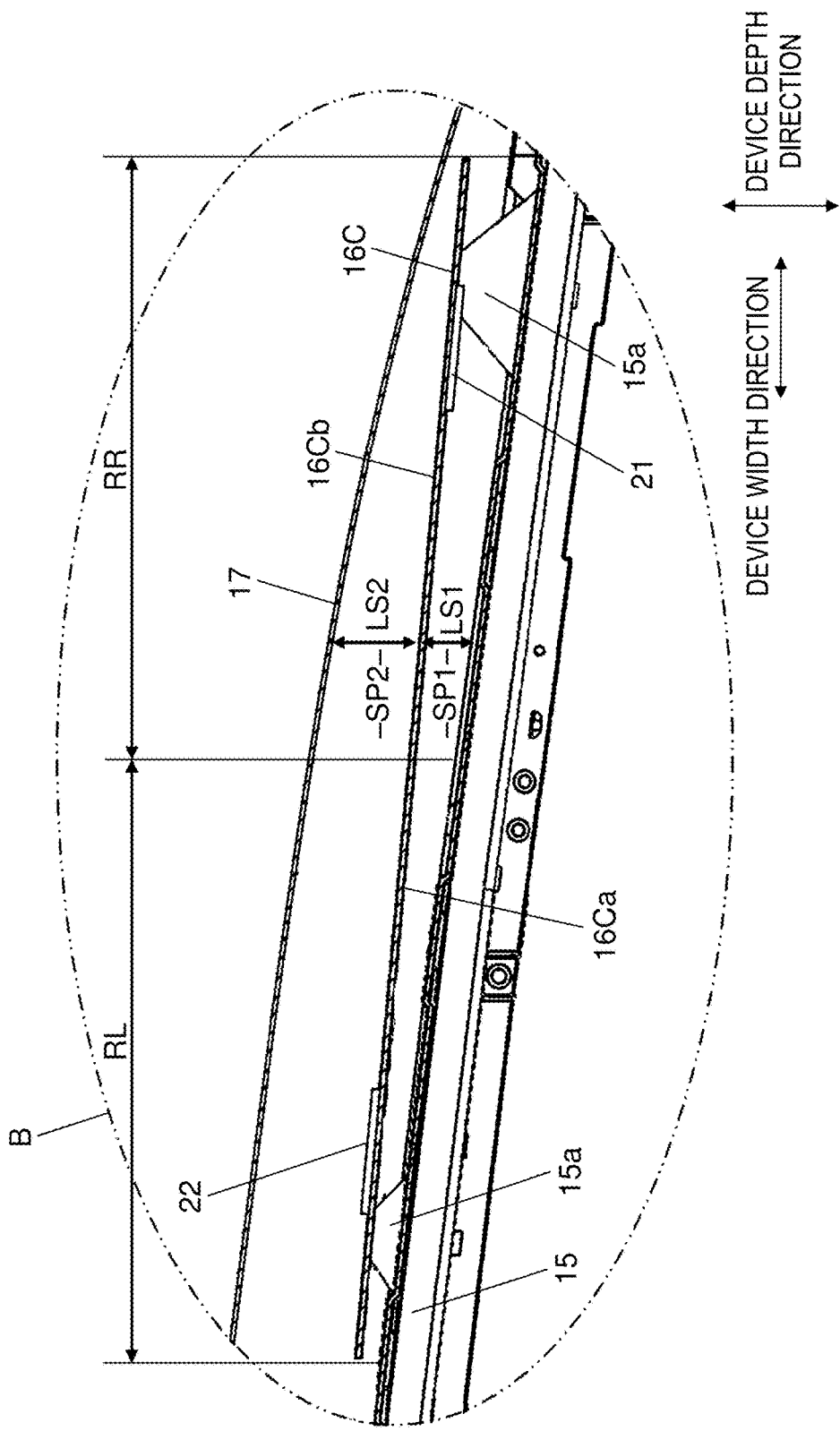
FIG. 6 is an enlarged view of a portion B of FIG. 5.

FIG. 5 is a cross-sectional view taken along line A-A of FIG. 4. FIG. 6 is an enlarged view of a portion B of FIG. 5. FIG. 5 illustrates the curved display device with the back cover attached.

As illustrated in FIG. 5 and FIG. 6, drive circuit board 16A, LED driver circuit board 16B, signal processing circuit board 16C, and power supply circuit board 16D are fixed on mounts 15a of metal chassis 15. A plurality of mounts 15a is provided on metal chassis 15. Mounts 15a may be constructed by protruding portions of the rear surface of metal chassis 15. Furthermore, mounts 15a may be constructed by fixing mount components to the rear surface of metal chassis 15.

As illustrated in FIG. 6, signal processing circuit board 16C of the present exemplary embodiment is disposed on one end side in the device width direction in a space between metal chassis 15 and back cover 17 such that a direction orthogonal to a pair of main surfaces, i.e., first main surface 16Ca and second main surface 16Cb, is approximately in the device depth direction.

In FIG. 6, first integrated circuit 21 is mounted on first main surface 16Ca of signal processing circuit board 16C. Furthermore, second integrated circuit 22 is mounted on second main surface 16Cb of signal processing circuit board 16C. First integrated circuit 21 and second integrated circuit 22 are circuit components for driving display panel 11. First integrated circuit 21 and second integrated circuit 22 are large scale integrated circuits (LSI) for image processing. Note that various circuit components are also mounted on first main surface 16Ca and second main surface 16Cb of signal processing circuit board 16C in addition to first integrated circuit 21 and second integrated circuit 22, but are omitted for explanation in FIG. 6.

An amount of heat generation of circuit components and the like which perform image processing and the like and are mounted on signal processing circuit board 16C is larger than that of other circuit components and the like. In particular, high resolutions of display panels to 4K, 8K and the like have been achieved in recent years and, as a result, amounts of processing of circuit components for performing image processing and the like have been drastically increased and amounts of heat generation of circuit components for performing image processing and the like have been increased. Accordingly, an amount of heat generation of signal processing circuit board 16C is larger than amounts of heat generation of other boards. In order to cope with such an increase in amounts of heat generation, following structures are adopted in the present exemplary embodiment.

Note that, in the present exemplary embodiment, an amount of heat generation of first integrated circuit 21 during operation is assumed to be larger than an average value of amounts of heat generation of all circuit components mounted on first main surface 16Ca of signal processing circuit board 16C during operation. Furthermore, an amount of heat generation of second integrated circuit 22 during operation is assumed to be larger than an average value of amounts of heat generation of all circuit components mounted on second main surface 16Cb of signal processing circuit board 16C during operation. In addition, in the present exemplary embodiment, amounts of heat generation of first integrated circuit 21 and second integrated circuit 22 during operation each are assumed to be largest or second largest among those of all circuit components mounted on signal processing circuit board 16C.

As illustrated in FIG. 6, a height (a length in the device depth direction) of mount 15a is different depending on a position in the device width direction. In particular, a height of mount 15a on an end side in the device width direction is larger than a height of mount 15a on a center side in the device width direction. Thus, length LS1 in the device depth direction of first space SP1 between signal processing circuit board 16C and metal chassis 15 at a position in the device width direction becomes larger as the position is closer to an end of first space SP1. First space SP1 is a space between signal processing circuit board 16C and metal chassis 15 (member), which faces first main surface 16Ca on which first integrated circuit 21 is mounted, out of metal chassis 15 and back cover 17.

On the other hand, length LS2 in the device depth direction of second space SP2 between signal processing circuit board 16C and back cover 17 at a position in the device width direction becomes larger as the position is closer to a center of second space SP2. Second space SP2 is a space between signal processing circuit board 16C and back cover 17 facing second main surface 16Cb on which second integrated circuit 22 is mounted.

RL, RR denote two regions obtained by dividing an entire region of first main surface 16Ca of signal processing circuit board 16C into two in the device width direction. First integrated circuit 21 is disposed in region RR where length LS1 in the device depth direction of first space SP1 is longest.

Similarly, RL, RR denote two regions obtained by dividing an entire region of second main surface 16Cb of signal processing circuit board 16C into two in the device width direction. Second integrated circuit 22 is disposed in region RL where length LS2 in the device depth direction of second space SP2 is longest.

[1-1-3. Heat Sink]

Figure 7:
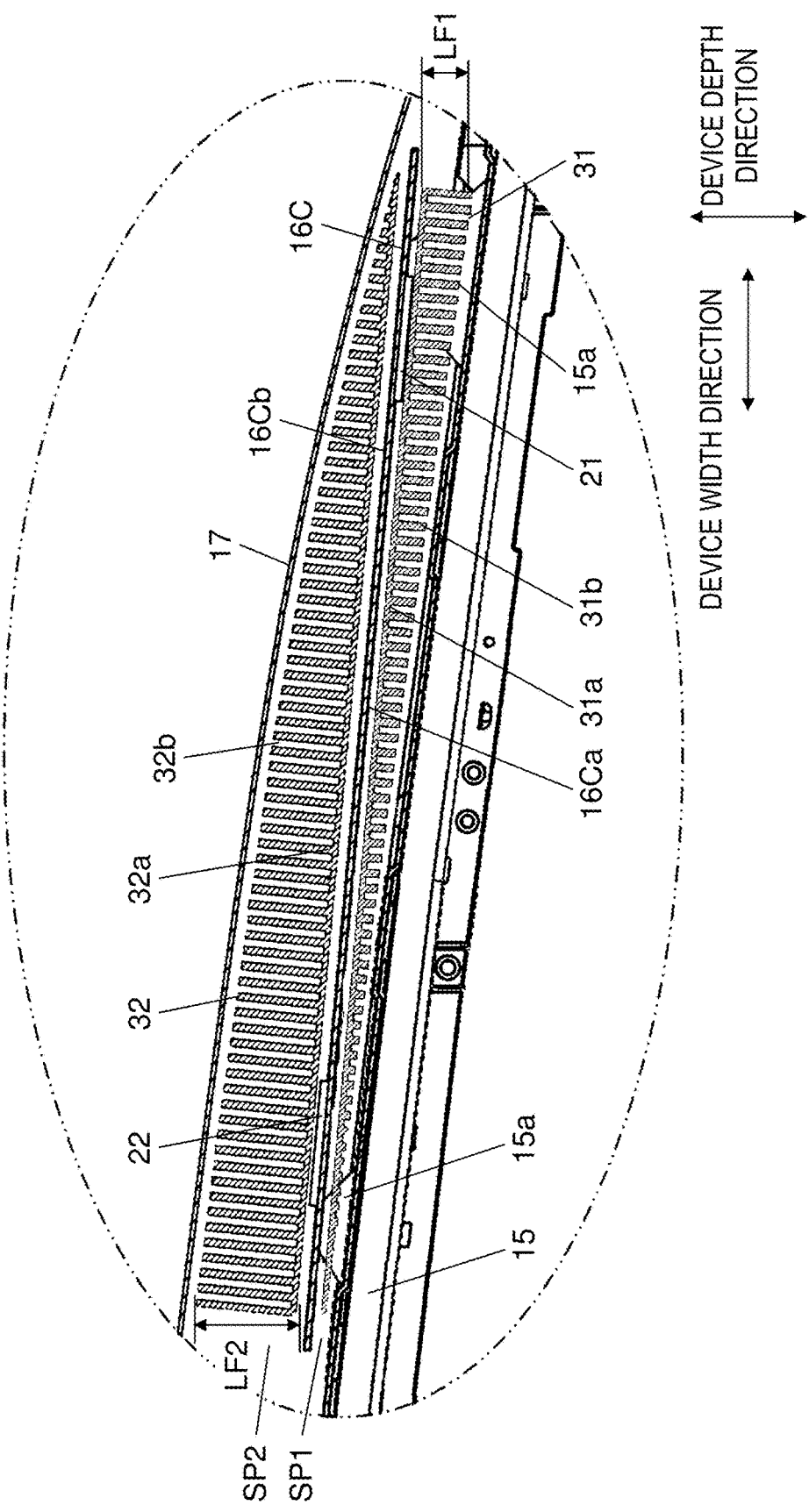
FIG. 7 is a diagram illustrating an example of a heat radiation structure of the curved display device according to the first exemplary embodiment.

FIG. 7 is a diagram illustrating an example of a heat radiation structure of curved display device 100 according to the first exemplary embodiment. FIG. 7 is an enlarged view in which heat sinks are provided on a metal-chassis-15 side and a back-cover-17 side of signal processing circuit board 16C of FIG. 6. As illustrated in FIG. 7, curved display device 100 has first heat sink 31 for cooling first integrated circuit 21 and second heat sink 32 for cooling second integrated circuit 22.

First heat sink 31 is disposed in first space SP1 between metal chassis 15 and signal processing circuit board 16C. First heat sink 31 has base 31a of a plate shape and a plurality of fins 31b which rises from base 31a. Base 31a has an area approximately equal to that of signal processing circuit board 16C. Base 31a contacts first integrated circuit 21 directly or via thermal conductive material so as to enable heat conduction. First heat sink 31 is formed of metallic material or the like having a high thermal conductivity.

Length LF1 in the device depth direction of a fin of the plurality of fins 31b of first heat sink 31 is set according to length LS1 in the device depth direction of first space SP1 at a position in the device width direction of the fin. In the present exemplary embodiment, length LF1 in the device depth direction of a fin of the plurality of fins 31b of first heat sink 31 becomes larger along a curved surface shape of a back surface of metal chassis 15 as a position of the fin is closer to an end in the device width direction of first space SP1.

The second heat sink 32 is disposed in second space SP2 between back cover 17 and signal processing circuit board 16C. Second heat sink 32 has base 32a of a plate shape and a plurality of fins 32b which rises from base 32a. Base 32a has an area approximately equal to that of signal processing circuit board 16C. Base 32a contacts second integrated circuit 22 directly or via thermal conductive material so as to enable heat conduction. Second heat sink 32 is formed of metallic material or the like having a high thermal conductivity.

Lengths LF2 in the device depth direction of the plurality of fins 32b of second heat sink 32 are set according to lengths LS2 in the device depth direction of second space SP2. In the present exemplary embodiment, length LF2 in the device depth direction of a fin of the plurality of fins 32b of second heat sink 32 becomes larger along a curved shape of a front surface of back cover 17 as a position of the fin is closer to a center in the device width direction of second space SP2.

[1-2. Heat Radiation Effects]

Figure 8:
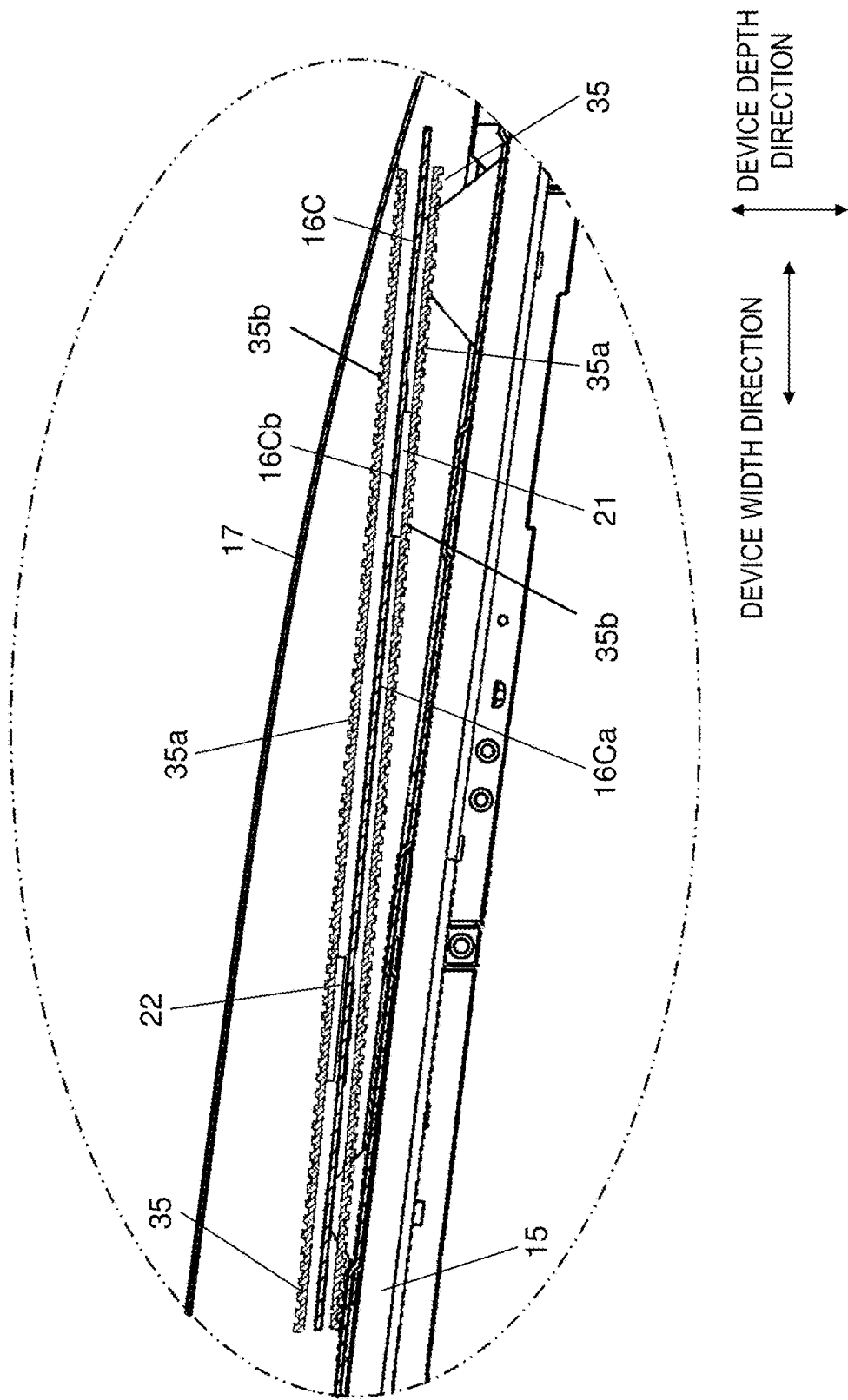
FIG. 8 is a diagram illustrating an example of a heat radiation structure as a comparative example of FIG. 7.

Heat radiation effects due to the radiation structure of curved display device 100 of the present exemplary embodiment are explained in comparison with a comparative example. FIG. 8 is a diagram illustrating an example of a heat radiation structure of curved display device 100 as a comparative example of FIG. 7. As illustrated in FIG. 8, the curved display device of the comparative example has two heat sinks 35 for cooling first integrated circuit 21 and second integrated circuit 22. Each of two heat sinks 35 has a plurality of fins 35b having a predetermined height which extends from plate-shaped base 35a toward a back side in the device depth direction. A difference between the present exemplary embodiment and the comparative example is a difference in lengths of the fins. The length of the fins of the comparative example is set to a constant height without considering the lengths in the device depth direction of first space SP1 and second space SP2.

Figure 9:
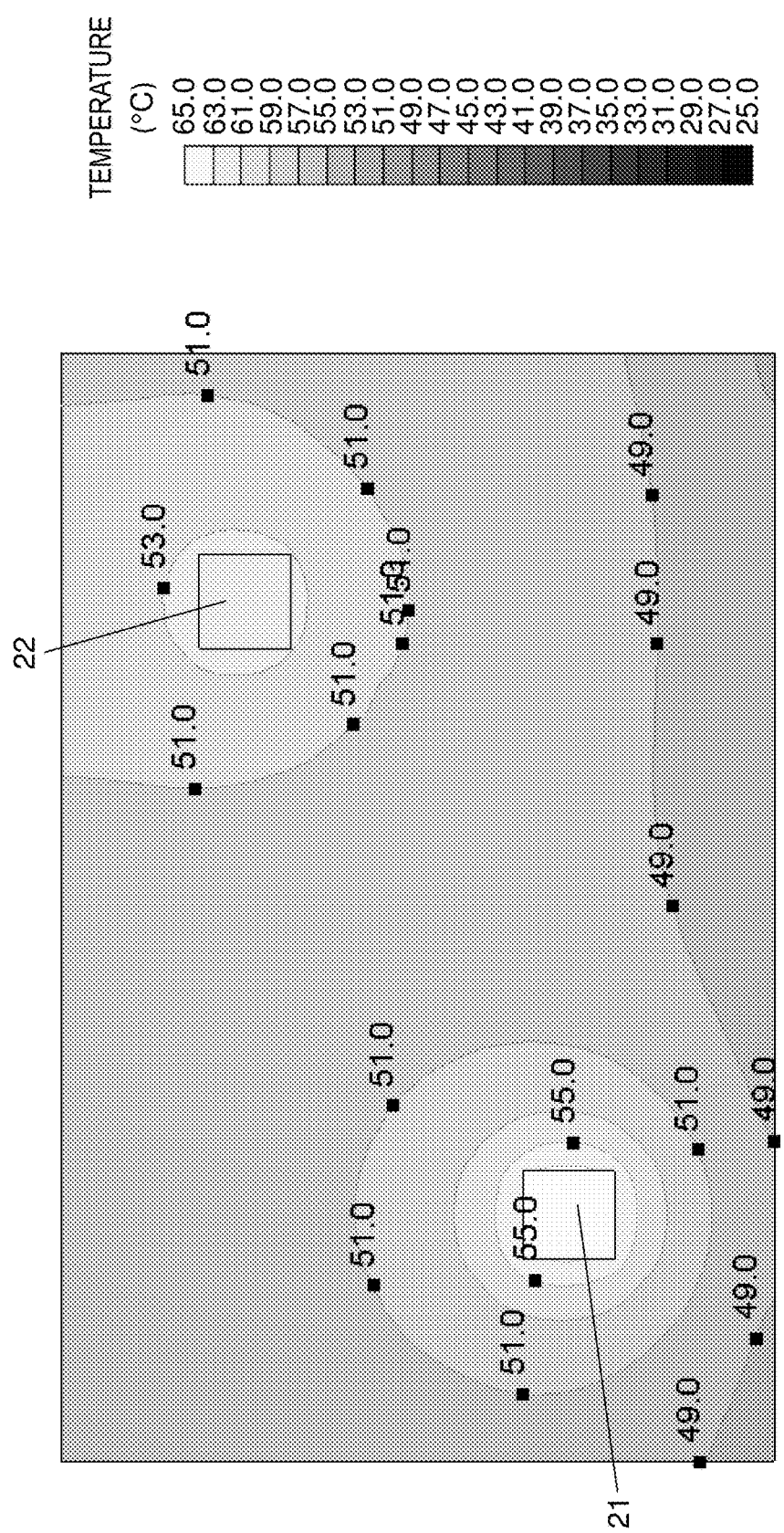
FIG. 9 is a diagram illustrating a temperature distribution of a thermal simulation result of FIG. 7.
Figure 10:
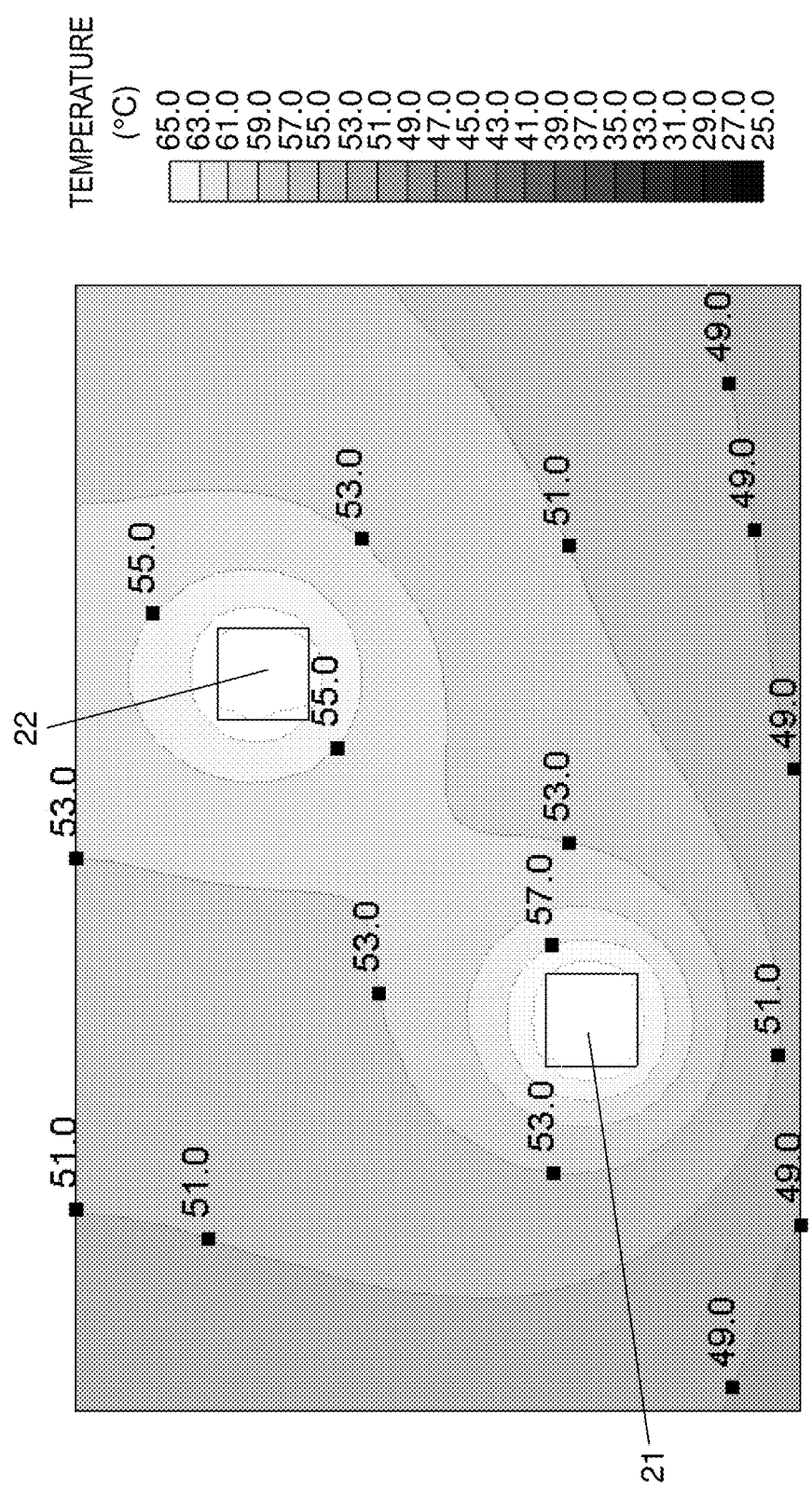
FIG. 10 is a diagram illustrating a temperature distribution of a thermal simulation result of FIG. 8.

FIG. 9 is a diagram illustrating a temperature distribution of a thermal simulation result of the radiation structure of the present exemplary embodiment in FIG. 7. FIG. 10 is a diagram illustrating a temperature distribution of a thermal simulation result of the radiation structure of the comparative example in FIG. 8.

HeatDesigner version 10 (Software Cradle Co., Ltd.) is used in thermal simulation. Setting conditions for the thermal simulation are as follows.

(1) Environmental temperature: 25° C.
(2) Board size of signal processing circuit board 16C: 240 mm (width)×160 mm (height)×1.2 mm (thickness)
(3) Component size of first integrated circuit 21 and second integrated circuit 22: 20 mm (width)×20 mm (height)×2 mm (thickness)
(4) Amount of heat generation of first integrated circuit 21 and second integrated circuit 22: 6 W
(5) Heat sink 35 of the comparative example: base thickness 1 mm, fin width 1 mm, pitch 6 mm, heat sink height: 2 mm constant
(6) First heat sink 31 of the exemplary embodiment: base thickness 1 mm, fin width 1 mm, pitch 6 mm, heat sink height: minimum 2 mm, maximum 8 mm
(7) Second heat sink 32 of the exemplary embodiment: base thickness 1 mm, fin width 1 mm, pitch 6 mm, rear-surface-side heat sink height: minimum 2 mm, maximum 8 mm As illustrated in FIG. 10, in the comparative example, a temperature at a disposition position of first integrated circuit 21 is approximately 57 degrees and a temperature at a disposition position of second integrated circuit 22 is approximately 55 degrees. In contrast, in the present exemplary embodiment, as illustrated in FIG. 9, a temperature of the disposition position of first integrated circuit 21 on signal processing circuit board 16C is approximately 55 degrees and a temperature of the disposition position of second integrated circuit 22 is approximately 53 degrees. Although temperatures at positions where first integrated circuit 21 and second integrated circuit 22 are disposed are highest in signal processing circuit board 16C, maximum temperatures, at positions where first integrated circuit 21 and second integrated circuit 22 are disposed, obtained by using the radiation structure of the present exemplary embodiment may be reduced by approximately 2 degrees from maximum temperatures obtained by using the radiation structure of the comparative example.

[1-3. Advantageous Effects etc.]

Curved display device 100 according to the present exemplary embodiment includes display panel 11, metal chassis 15 (chassis), back cover 17, and signal processing circuit board 16C (circuit board). Display panel 11, metal chassis 15 (chassis), and back cover 17 each have a curved shape such that both end sides in the device width direction protrude forward from a center side. On first main surface 16Ca (one main surface) of signal processing circuit board 16C, first integrated circuit 21 (first circuit component) and first heat sink 31 for cooling first integrated circuit 21 are mounted.

A first space SP1 (first space) denotes a space between signal processing circuit board 16C and metal chassis 15 (member), which faces first main surface 16Ca on which first integrated circuit 21 is mounted, out of metal chassis 15 and back cover 17. First integrated circuit 21 is disposed in region RR, where length LS1 in the device depth direction of first space SP1 is longest, out of two regions RL, RR obtained by dividing an entire region of first main surface 16Ca of signal processing circuit board 16C into two in the device width direction.

In addition, first heat sink 31 is disposed in first space SP1 and has a plurality of fins 31b. Length LF1 in the device depth direction of a fin of the plurality of fins 31b is set according to length LS1 in the device depth direction of first space SP1 at a position in the device width direction of the fin.

Thereby, first integrated circuit 21 is disposed at a position in the device width direction where length LS1 in the device depth direction of first space SP1 is relatively long. Therefore, heat generated from first integrated circuit 21 is easily diffused into first space SP1. In addition, first integrated circuit 21 is cooled by first heat sink 31. In this case, lengths LF1 in the device depth direction of the plurality of fins 31b of first heat sink 31 are longer than lengths of fins 31b at other positions in the device width direction. Therefore, it is possible to cool first integrated circuit 21 more effectively by using first heat sink 31 than by using other components.

Accordingly, increases in temperatures of first integrated circuit 21 and signal processing circuit board 16C due to heat generated from first integrated circuit 21 may be effectively suppressed.

In the present exemplary embodiment, second integrated circuit 22 is mounted on second main surface 16Cb (other main surface) of signal processing circuit board 16C.

A second space SP2 (second space) denotes a space between signal processing circuit board 16C and back cover 17 (member), which faces second main surface 16Cb on which second integrated circuit 22 is mounted, out of metal chassis 15 and back cover 17. Second integrated circuit 22 is disposed in region RL, where length LS2 in the device depth direction of second space SP2 is longest, out of two regions RL, RR obtained by dividing an entire region of second main surface 16Cb of signal processing circuit board 16C into two in the device width direction.

Therefore, second integrated circuit 22 is disposed at a position in the device width direction where length LS2 in the device depth direction of second space SP2 is relatively long. Thus, heat generated from second integrated circuit 22 is easily diffused into second space SP2.

In the present exemplary embodiment, curved display device 100 further includes second heat sink 32 for cooling second integrated circuit 22. Second heat sink 32 is disposed in second space SP2 and has a plurality of fins 32b which extends in the device depth direction. Length LF2 in the device depth direction of a fin of the plurality of fins 32b of second heat sink 32 is set according to length LS2 in the device depth direction of second space SP2 at a position in the device width direction of the fin.

Thereby, second integrated circuit 22 is cooled by second heat sink 32. In this case, lengths LF2 in the device depth direction of the plurality of fins 32b of second heat sink 32 are longer than lengths LF2 in the device depth direction of fins 32b at other positions in the device width direction. Therefore, it is possible to cool second integrated circuit 22 more effectively by using second heat sink 32 than by using other components.

Accordingly, increases in temperatures of second integrated circuit 22 and signal processing circuit board 16C due to heat generated from second integrated circuit 22 may be effectively suppressed.

In the present exemplary embodiment, first integrated circuit 21 is a circuit component whose amount of heat generation is larger than an average value of amounts of heat generation of all circuit components mounted on first main surface 16Ca of signal processing circuit board 16C.

Thereby, first integrated circuit 21 whose amount of heat generation is larger than an average value may be effectively cooled.

In the present exemplary embodiment, first integrated circuit 21 is a circuit component whose amount of heat generation is largest among all circuit components mounted on signal processing circuit board 16C.

Thereby, first integrated circuit 21 whose amount of heat generation is largest may be effectively cooled.

In the present exemplary embodiment, first integrated circuit 21 is a large scale integrated circuit.

Thereby, a large scale integrated circuit whose amount of heat generation tends to become large compared with other components may be effectively cooled.

Modified Examples of First Exemplary Embodiment

Figure 11:
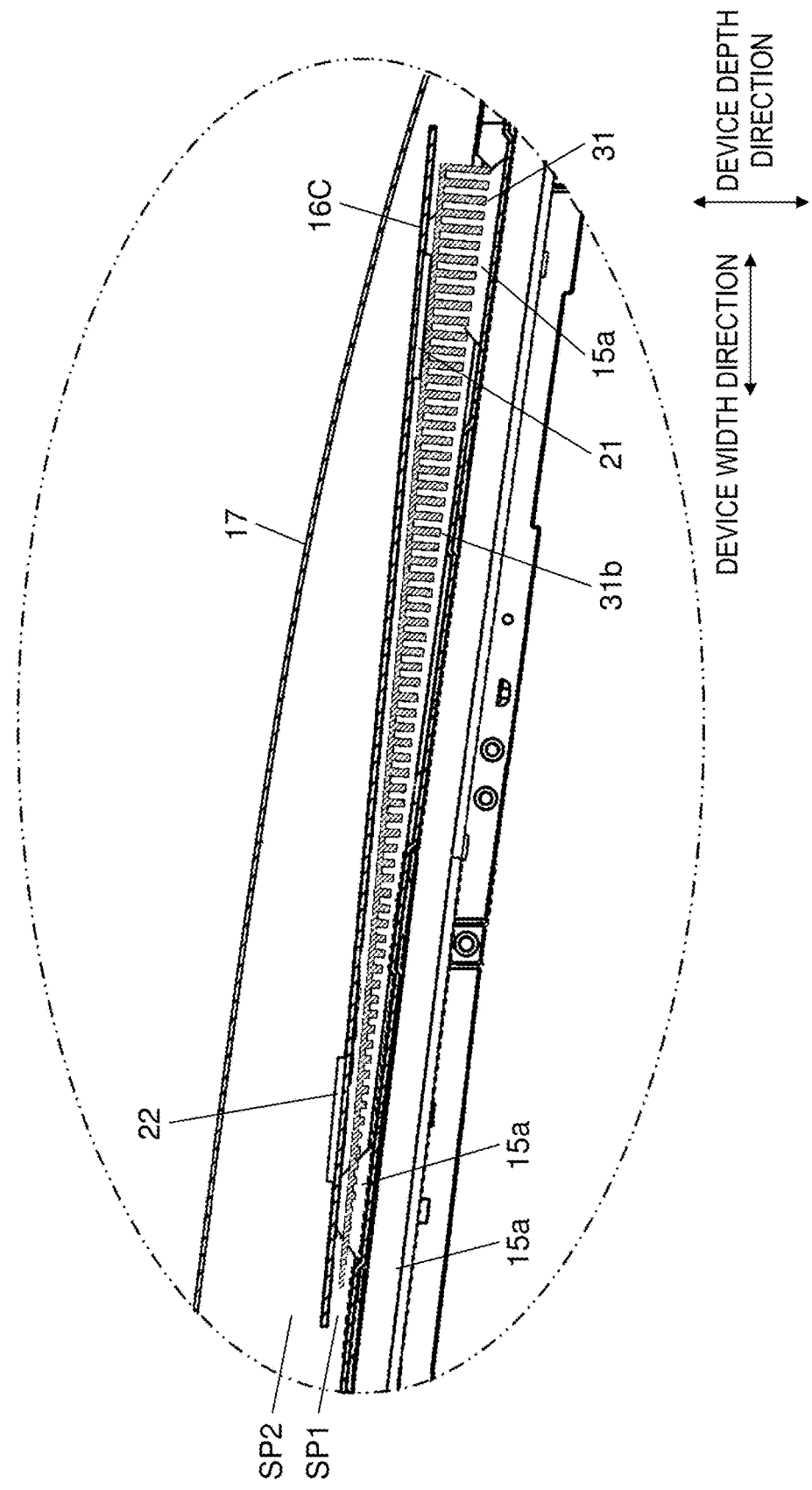
FIG. 11 is a diagram illustrating an example of another heat radiation structure of the curved display device according to the first exemplary embodiment.
Figure 12:
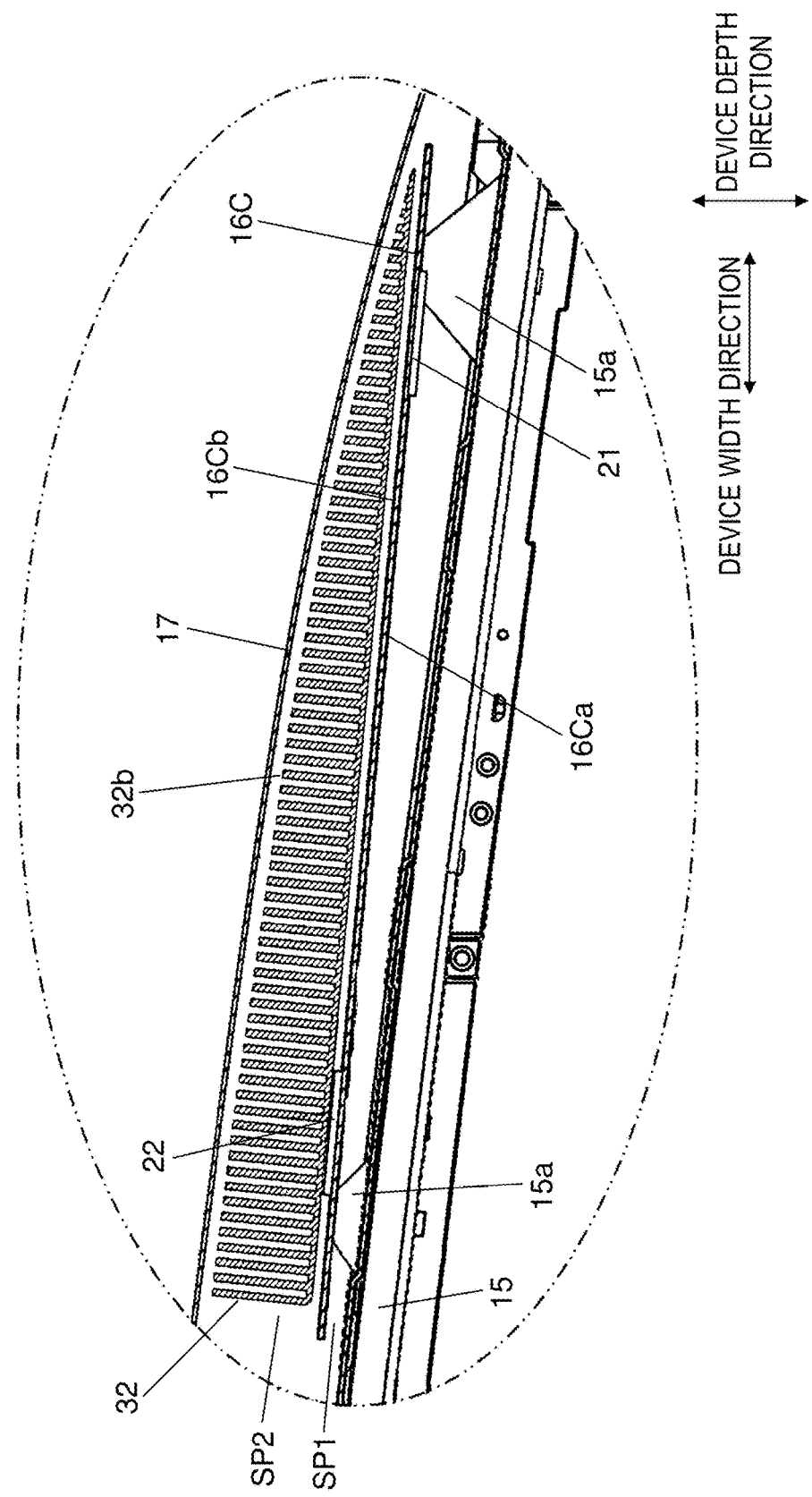
FIG. 12 is a diagram illustrating an example of still another heat radiation structure of the curved display device according to the first exemplary embodiment.

FIG. 11 and FIG. 12 are diagrams illustrating examples of other heat radiation structures of curved display device 100 according to the first exemplary embodiment. FIG. 11 is an enlarged view in which a heat sink is provided only on a metal-chassis-15 side of the signal processing circuit board of FIG. 6. FIG. 12 is an enlarged view in which a heat sink is provided only on a back-cover-17 side of the signal processing circuit board of FIG. 6.

In the example illustrated in FIG. 11, first heat sink 31 is provided only in first space SP1 in which first integrated circuit 21 is disposed. In the example illustrated in FIG. 12, second heat sink 32 is provided only in second space SP2 in which second integrated circuit 22 is disposed. Whether first heat sink 31 or second heat sink 32 is provided in either one of first space SP1 where first integrated circuit 21 is disposed or second space SP2 where second integrated circuit 22 is disposed may be comprehensively determined based on amounts of heat generation of first integrated circuit 21 and second integrated circuit 22, amounts of heat generation of surrounding components, ventilation characteristics of cooling air, and the like.

Note that, in the present modified examples, an integrated circuit disposed in a space where first heat sink 31 or second heat sink 32 is provided corresponds to a first circuit component in the present disclosure, and an integrated circuit disposed in a space where any heat sinks are not provided corresponds to a second circuit component in the present disclosure.

Second Exemplary Embodiment

A curved display device according to a second exemplary embodiment is described. In the curved display device according to the second exemplary embodiment, signal processing circuit board 16C is disposed near a center of the curved display device in the device width direction. Note that description of the same or similar components as those in the first exemplary embodiment is omitted as deemed appropriate.

[2-1. Structure]
[2-1-1. Summary]

Figure 13:
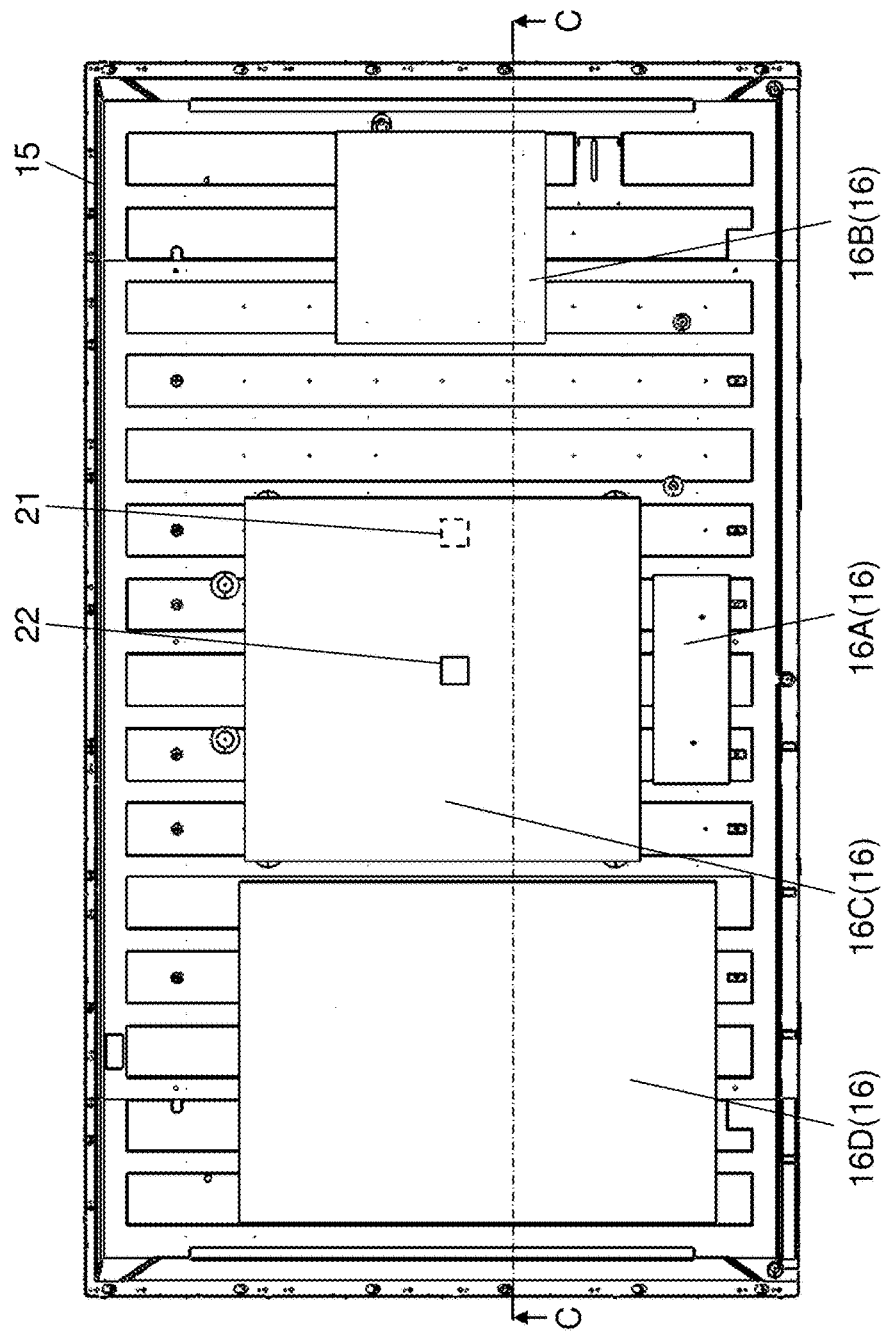
FIG. 13 is a rear view of a curved display device according to a second exemplary embodiment with a back cover removed.

FIG. 13 is a rear view of the curved display device according to the second exemplary embodiment with back cover 17 removed. In the present exemplary embodiment, drive circuit board 16A, LED driver circuit board 16B, signal processing circuit board 16C, and power supply circuit board 16D are provided as a plurality of circuit boards 16.

[2-1-2. Mounting Structure of Circuit Board on Metal Chassis and Mounting of Circuit Components etc. on Circuit Boards]

Figure 14:
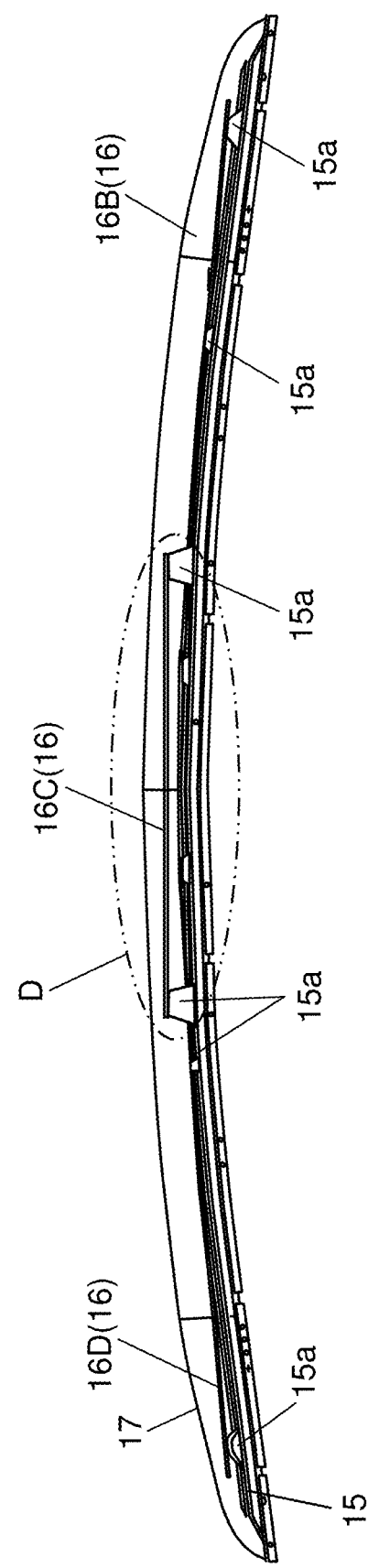
FIG. 14 is a cross-sectional view taken along line C-C of the curved display device of FIG. 13 with the back cover attached.

FIG. 14 is a cross-sectional view taken along line C-C of FIG. 13. Note that, FIG. 14 illustrates the curved display device with the back cover attached. As illustrated in FIG. 14, drive circuit board 16A (not illustrated), LED driver circuit board 16B, signal processing circuit board 16C, and power supply circuit board 16D are fixed on mounts 15a of metal chassis 15.

Figure 15:
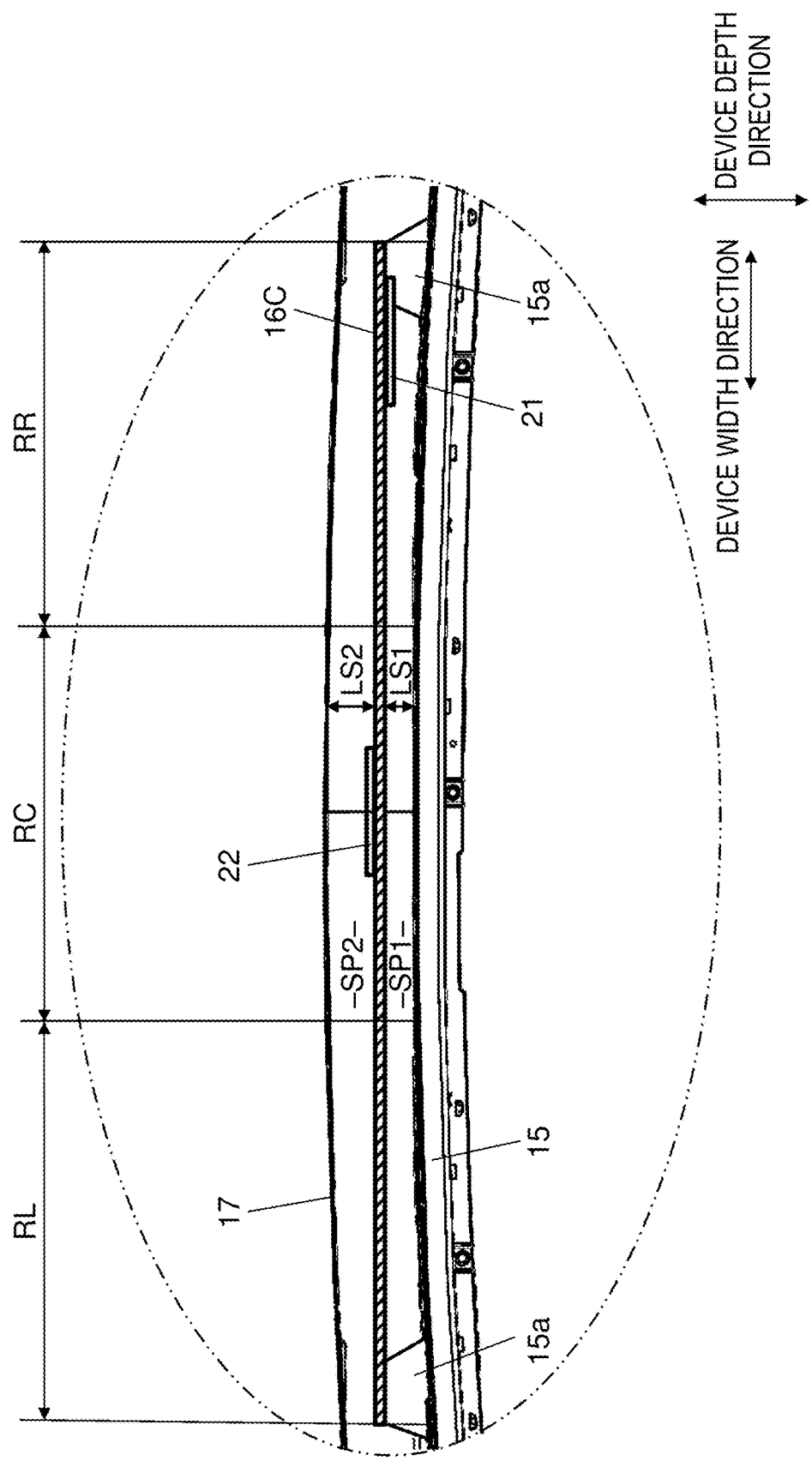
FIG. 15 is an enlarged view of a portion D of FIG. 14.

FIG. 15 is an enlarged view of a portion D of FIG. 14. As illustrated in FIG. 15, heights (lengths in the device depth direction) of left and right mounts 15a are the same near a center in the device width direction of the curved display device. Thereby, length LS1 in the device depth direction of first space SP1 between signal processing circuit board 16C and metal chassis 15 at a position in the device width direction becomes larger as the position is closer to an end of first space SP1. On the other hand, length LS2 in the device width direction of second space SP2 between signal processing circuit board 16C and back cover 17 at a position in the device width direction becomes larger as the position is closer to a center of second space SP2.

In signal processing circuit board 16C, first integrated circuit 21 and second integrated circuit 22 for driving display panel 11 are mounted. First integrated circuit 21 and second integrated circuit 22 each are integrated circuits for image processing. First integrated circuit 21 and second integrated circuit 22 are a component whose amount of heat generation is largest or second largest among components mounted on signal processing circuit board 16C.

First integrated circuit 21 is mounted on first main surface 16Ca out of a pair of main surfaces of signal processing circuit board 16C. Furthermore, first integrated circuit 21 is disposed in region RR, where length LS1 in the device depth direction of first space SP1 is largest, among three regions RL, RC, RR obtained by dividing an entire region of first main surface 16Ca of signal processing circuit board 16C into three in the device width direction. First space SP1 is a space between signal processing circuit board 16C and metal chassis 15, which faces first main surface 16Ca on which first integrated circuit 21 is mounted, out of metal chassis 15 and back cover 17.

Note that, although first integrated circuit 21 is disposed in region RR in the present exemplary embodiment, it may be disposed in region RL since the same length as that in region RR may be ensured in region RL which is at an opposite end in the device width direction.

Second integrated circuit 22 is mounted on second main surface 16Cb of signal processing circuit board 16C. Furthermore, second integrated circuit 22 is disposed in region RC, where length LS2 in the device depth direction of second space SP2 is largest, among three regions RL, RC, RR obtained by dividing an entire region of second main surface 16Cb of signal processing circuit board 16C into three in the device width direction. Second space SP2 is a space between signal processing circuit board 16C and back cover 17, which faces second main surface 16Cb on which second integrated circuit 22 is mounted, out of metal chassis 15 and back cover 17.

[2-1-3. Heat Sink]

Figure 16:
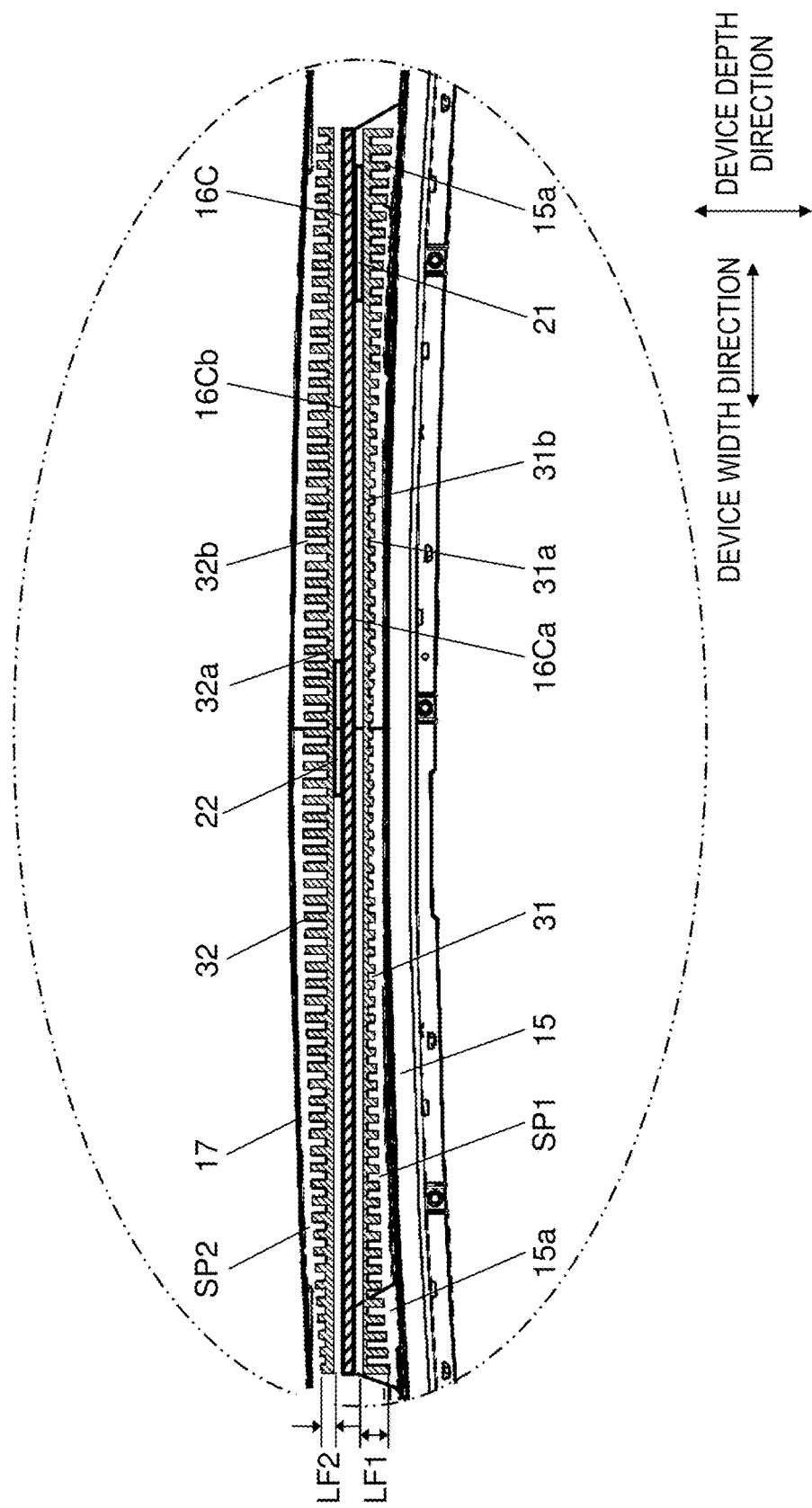
FIG. 16 is a diagram illustrating an example of a heat radiation structure of the curved display device according to the second exemplary embodiment.

FIG. 16 is a diagram illustrating an example of a heat radiation structure of signal processing circuit board 16C according to the second exemplary embodiment. FIG. 16 is an enlarged view in which heat sinks are provided on a metal-chassis-15 side and a back-cover-17 side of the signal processing circuit board of FIG. 15. As illustrated in FIG. 16, curved display device 100 has first heat sink 31 for cooling first integrated circuit 21 and second heat sink 32 for cooling second integrated circuit 22.

First heat sink 31 is disposed in first space SP1 between metal chassis 15 and signal processing circuit board 16C. First heat sink 31 has base 31a of a plate shape and a plurality of fins 31b which rises from base 31a. Base 31a has an area approximately equal to that of signal processing circuit board 16C. Base 31a contacts first integrated circuit 21 directly or via thermal conductive material so as to enable heat conduction. First heat sink 31 is formed of metallic material or the like having a high thermal conductivity.

Length LF1 in the device depth direction of a fin of the plurality of fins 31b of first heat sink 31 is set according to length LS1 in the device depth direction of first space SP1 at a position in the device width direction of the fin. In the present exemplary embodiment, length LF1 in the device depth direction of a fin of the plurality of fins 31b of first heat sink 31 becomes larger along a curved shape of a back surface of metal chassis 15 as a position of the fin is closer to an end in the device width direction of first space SP1.

Second heat sink 32 is disposed in second space SP2 between back cover 17 and signal processing circuit board 16C. Second heat sink 32 has base 32a of a plate shape and a plurality of fins 32b which rises from base 32a. Base 32a has an area approximately equal to that of signal processing circuit board 16C. Base 32a contacts second integrated circuit 22 directly or via thermal conductive material so as to enable heat conduction. Second heat sink 32 is formed of metallic material or the like having a high thermal conductivity.

Lengths LF2 in the device depth direction of the plurality of fins 32b of second heat sink 32 are set according to lengths LS2 in the device depth direction of second space SP2. In the present exemplary embodiment, length LF2 in the device depth direction of a fin of the plurality of fins 32b of second heat sink 32 becomes larger along a curved shape of a front surface of back cover 17 as a position of the fin is closer to a center in the device width direction of second space SP2.

[2-2. Advantageous Effects etc.]

Curved display device 100 according to the present exemplary embodiment includes display panel 11, metal chassis 15 (chassis), back cover 17, and signal processing circuit board 16C (circuit board). Display panel 11, metal chassis 15 (chassis), and back cover 17 each have a curved shape such that both end sides in the device width direction protrude forward from a center side.

First integrated circuit 21 (first circuit component) and first heat sink 31 are mounted on first main surface 16Ca (one main surface) of signal processing circuit board 16C.

First space SP1 (first space) is assumed to denote a space between signal processing circuit board 16C and metal chassis 15 (member), which faces first main surface 16Ca on which first integrated circuit 21 is mounted, out of metal chassis 15 and back cover 17. Then, first integrated circuit 21 is disposed in region RR, in which length LS1 in the device depth direction of first space SP1 is largest, among three regions RL, RC, RR obtained by dividing an entire region of first main surface 16Ca of signal processing circuit board 16C into three in the device width direction.

Curved display device 100 includes first heat sink 31 for cooling first integrated circuit 21. First heat sink 31 is disposed inside first space SP1 and has a plurality of fins 31b. Length LF1 in the device depth direction of a fin of the plurality of fins 31b is set according to length LS1 in the device depth direction of first space SP1 at a position in the device width direction of the fin.

Thereby, first integrated circuit 21 results in being disposed at a position in the device width direction where length LS1 in the device depth direction of first space SP1 in signal processing circuit board 16C is relatively long. Therefore, heat generated from first integrated circuit 21 is easily diffused into first space SP1. In addition, first integrated circuit 21 is cooled by first heat sink 31. In this case, lengths LF1 in the device depth direction of the plurality of fins 31b of first heat sink 31 at a position in the device width direction at which first integrated circuit 21 is disposed are longer than lengths of fins 31b at other positions in the device width direction. Therefore, first heat sink 31 may cool first integrated circuit 21 more effectively than other component does.

Accordingly, increases in temperatures of first integrated circuit 21 and signal processing circuit board 16C due to heat generated from first integrated circuit 21 may be effectively suppressed.

In the present exemplary embodiment, curved display device 100 further includes second integrated circuit 22 which is disposed on second main surface 16Cb (other main surface) of signal processing circuit boards 16C and drives display panel 11.

Second space SP2 (second space) is assumed to denote a space between signal processing circuit board 16C and back cover 17 (member), which faces second main surface 16Cb on which second integrated circuit 22 is mounted, out of metal chassis 15 and back cover 17. Then, second integrated circuit 22 is disposed in region RC, in which length LS2 in the device depth direction of second space SP2 is largest, among three regions RL, RC, RR obtained by dividing an entire region of second main surface 16Cb of signal processing circuit board 16C into three in the device width direction.

Thereby, second integrated circuit 22 results in being disposed at a position in the device width direction where length LS2 in the device depth direction of second space SP2 in signal processing circuit board 16C is relatively long. Therefore, heat generated from second integrated circuit 22 is easily diffused into second space SP2.

In the present exemplary embodiment, curved display device 100 further includes second heat sink 32 for cooling second integrated circuit 22.

Second heat sink 32 is disposed inside second space SP2 and includes a plurality of fins 32b which extends in the device depth direction.

Length LF2 in the device depth direction of a fin of the plurality of fins 32b of second heat sink 32 is set according to length LS2 in the device depth direction of second space SP2 at a position in the device width direction of the fin.

Thereby, second integrated circuit 22 is cooled by second heat sink 32. In this case, length LF2 in the device depth direction of the plurality of fins 32b of second heat sink 32 at a position in the device width direction where second integrated circuit 22 is disposed is longer than length LF2 in the device depth direction of fins 32b at other positions in the device width direction. Therefore, second heat sink 32 may cool second integrated circuit 22 more effectively than other component does. Accordingly, increases in temperatures of second integrated circuit 22 and signal processing circuit board 16C due to heat generated from second integrated circuit 22 may be effectively suppressed.

Modified Example of the Second Exemplary Embodiment

Figure 17:
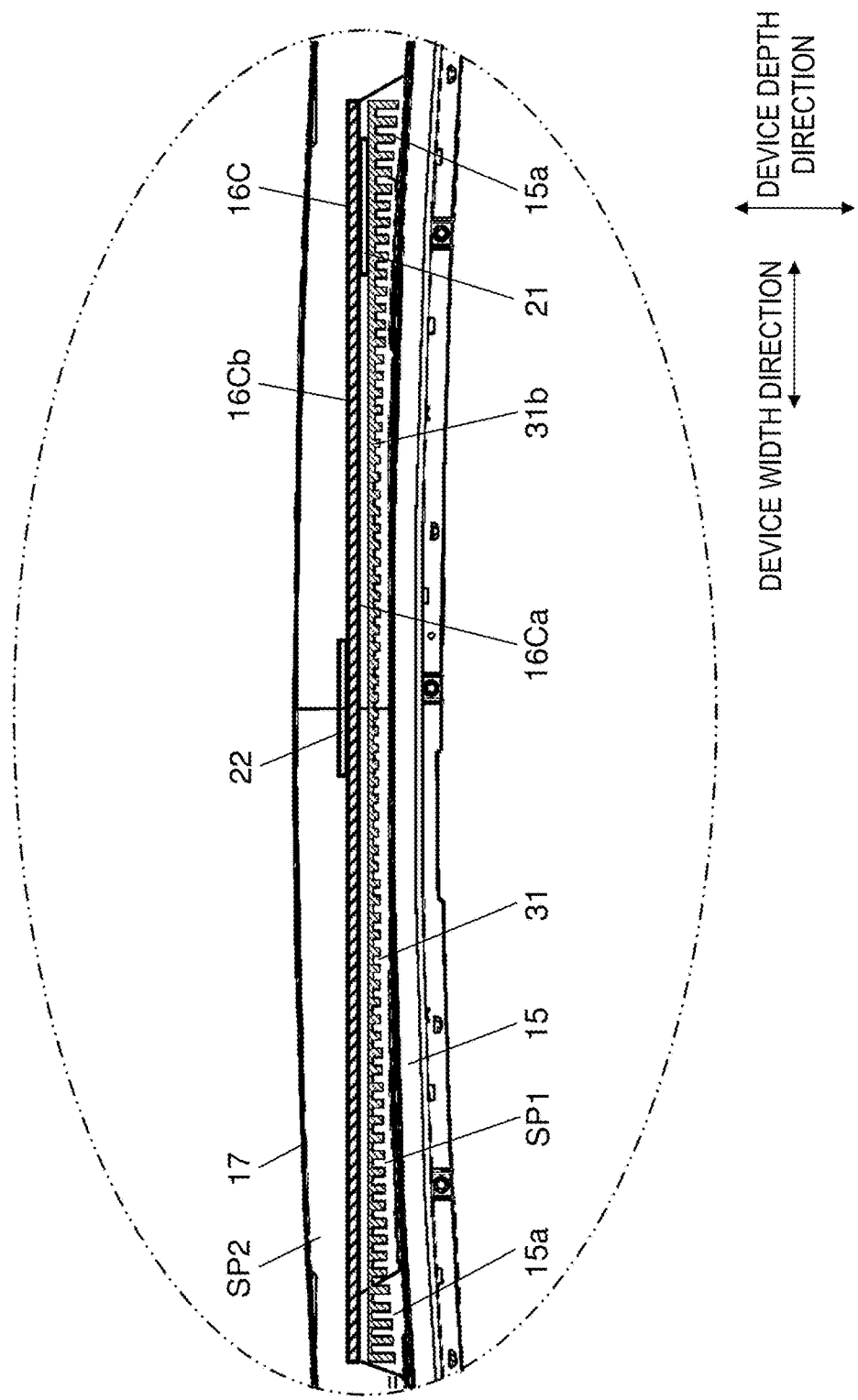
FIG. 17 is a diagram illustrating an example of another heat radiation structure of the curved display device according to the second exemplary embodiment.
Figure 18:
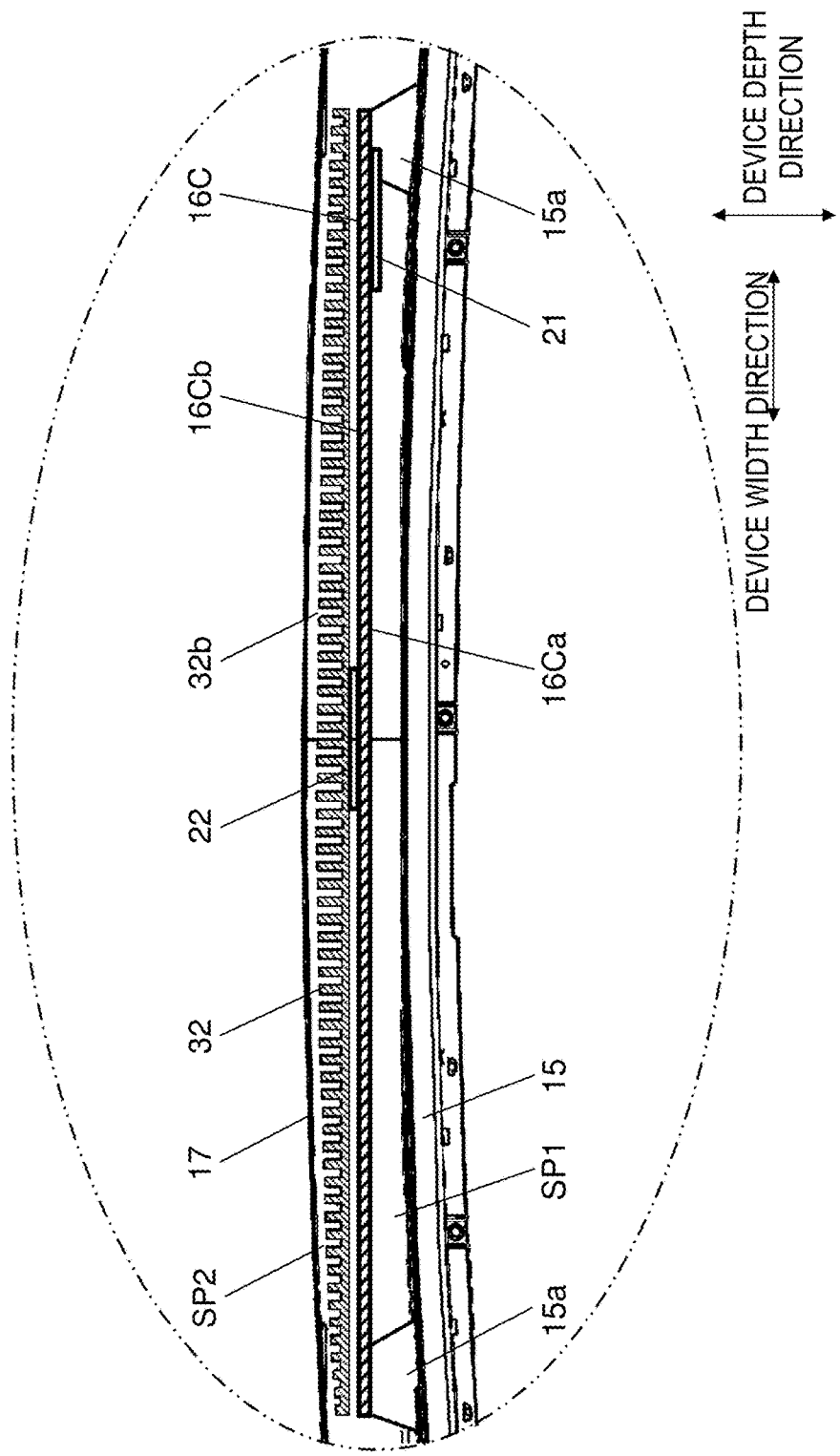
FIG. 18 is a diagram illustrating an example of still another heat radiation structure of the curved display device according to the second exemplary embodiment.

FIG. 17 and FIG. 18 are diagrams illustrating examples of other heat radiation structures of curved display device 100 according to the second exemplary embodiment. FIG. 17 is an enlarged view in which a heat sink is provided on a metal-chassis-15 side of the signal processing circuit board in FIG. 15. FIG. 18 is an enlarged view in which a heat sink is provided on a back-cover-17 side of a signal processing circuit board in FIG. 15. In the present exemplary embodiment, first heat sink 31 is provided only in first space SP1 in which first integrated circuit 21 is disposed, in an example illustrated in FIG. 17. In an example illustrated in FIG. 18, second heat sink 32 is provided only in second space SP2 in which second integrated circuit 22 is disposed.

Whether first heat sink 31 or second heat sink 32 is provided in either one of first space SP1 where first integrated circuit 21 is disposed or second space SP2 where second integrated circuit 22 is disposed may be comprehensively determined based on amounts of heat generation of first integrated circuit 21 and second integrated circuit 22, amounts of heat generation of surrounding components, ventilation characteristics of cooling air, and the like.

Note that, in the present modified examples, an integrated circuit disposed in a space where first heat sink 31 or second heat sink 32 is provided corresponds to a first circuit component in the present disclosure and an integrated circuit disposed in a space where no heat sinks are provided corresponds to a second circuit component in the present disclosure.

Other Exemplary Embodiments

As described above, the first and second exemplary embodiments are described as illustrations of techniques disclosed in the present application. However, techniques in the present disclosure are not limited to those disclosed and are applicable to exemplary embodiments obtained by performing modifications, substitutions, additions, omissions, or the like on the first and second exemplary embodiments as deemed appropriate. Furthermore, it is also possible to derive new exemplary embodiments by combining the components respectively described in the first and second exemplary embodiments.

Hereinafter, other exemplary embodiments are illustrated.

In the above exemplary embodiments, display panel 11 is a liquid crystal display panel. However, in the present disclosure, the display panel may be, for example, an organic EL type display panel or a plasma type display panel.

In the above exemplary embodiments, the circuit board of the present disclosure is applied to signal processing circuit board 16C. However, the present disclosure may be applicable not only to signal processing circuit board 16C but also to any circuit boards used in the curved display device. For example, the present disclosure is applicable to any of drive circuit board 16A, LED driver circuit board 16B, and power supply circuit board 16D. Alternatively, the present disclosure is applicable to a circuit board obtained by integrating two, three, or all of these circuit boards, circuit boards obtained by dividing these circuit boards into a plurality of circuit boards, or a circuit board obtained by modifying a combination of functions of these circuit boards as deemed appropriate.

In the above exemplary embodiments, only one circuit component generating a large amount of heat is mounted on one main surface of signal processing circuit board 16C. However, in the present disclosure, two or more circuit components generating large amounts of heat may be mounted on one main surface of signal processing circuit board 16C. In this case, the circuit components may be disposed in ascending order of heights of the fins with intervals in the device width direction with respect to adjacent circuit components. An interval may be set according to an amount of heat generation of each circuit component.

As described above, the first exemplary embodiment is described as an illustration of techniques in the present disclosure. For that purpose, the accompanying drawings and detailed description are provided.

Accordingly, components illustrated in the accompanying drawings and described in detailed description may include not only components essential for solving problems but also components which are described to illustrate the above techniques and are not essential for solving the problems. Therefore, it should not be certified that these non-essential components are essential directly, even if the non-essential components are illustrated in the accompanying drawings and described in detailed description.

In addition, since the above-mentioned exemplary embodiments are intended to illustrate the techniques in the present disclosure, various modifications, substitutions, additions, omissions, or the like may be made within the scope of claims and equivalents of the claims.

The present disclosure is widely applicable to curved display devices formed in a curved shape such that both end sides in a width direction protrude forward from a center side.

What is claimed is:

1. A curved display device comprising:
   a display panel having a curved shape such that both end sides of the display panel in a device width direction of the curved display device protrude forward relative to a center side of the display panel;
   a chassis having a curved shape which approximately corresponds to the curved shape of the display panel, the chassis being disposed on a rear side of the display panel;
   a back cover having a curved shape which approximately corresponds to the curved shape of the chassis, the back cover being disposed, with an interval from the chassis in a device depth direction of the curved display device on a rear side of the chassis;
   a circuit board having a plate shape with a pair of main surfaces in parallel with each other, the circuit board being disposed in a space between the chassis and the back cover such that a direction perpendicular to the pair of main surfaces is in the device depth direction;
   a first circuit component, mounted on a first main surface of the pair of main surfaces of the circuit board, for driving the display panel; and
   a first heat sink for cooling the first circuit component,
   wherein in the device depth direction, a first portion of the space between the circuit board and one of the chassis and the back cover that opposes the first main surface on which the first circuit component is mounted,
   the first circuit component is disposed in a region, in which a length of the first portion of the space in the device depth direction is larger than at least one of a plurality of regions obtained by dividing an entire region of the first main surface of the circuit board into two or three regions in the device width direction, the first heat sink is disposed in the first portion of the space and has a plurality of fins each of which extends in the device depth direction, a length of each of the plurality of fins in the device depth direction is set according to a length of the first portion of the space in the device depth direction at a position of each of the plurality of fins in the device width direction, and an average length of the plurality of fins which overlay the first circuit component in the device depth direction is greater than an average length of the remaining plurality of fins which do not overlay the first circuit component in the device depth direction.

2. The curved display device according to claim 1, further comprising a second circuit component, mounted on a second main surface of the pair of main surfaces of the circuit board, for driving the display panel, wherein in the depth direction, a second portion of the space between the circuit board and another of the chassis and the back cover that opposes the second main surface on which the second circuit component is mounted, the second circuit component is disposed in a region, in which a length of the second portion of the space in the device depth direction is larger than at least one of the plurality of regions obtained by dividing an entire region of the second main surface of the circuit board into the two or three regions in the device width direction.

3. The curved display device according to claim 2, further comprising a second heat sink for cooling the second circuit component, wherein the second heat sink is disposed in the second portion of the space and has a plurality of fins which extends in the device depth direction and a length of each of the plurality of fins in the device depth direction of the second heat sink is set according to a length of the second portion of the space in the device depth direction at a position of the fin in the device width direction.

4. The curved display device according to claim 1, wherein the first circuit component is a circuit component whose amount of heat generation is larger than an average value of amounts of heat generation of all circuit components mounted on the first main surface of the circuit board.

5. The curved display device according to claim 1, wherein the first circuit component is a circuit component having a largest amount of heat generation among all circuit components mounted on the circuit board.

6. The curved display device according to claim 1, wherein the first circuit component is a large scale integrated circuit.

7. The curved display device according to claim 1, wherein the length of each of the plurality of fins in the device depth direction varies over the device width direction.

\* \* \* \* \*